United States Patent
Usa et al.

(10) Patent No.: US 7,229,743 B2
(45) Date of Patent: Jun. 12, 2007

(54) ELECTRON BEAM LITHOGRAPHY METHOD, PATTERNED MASTER CARRIER FOR MAGNETIC TRANSFER, LITHOGRAPHY METHOD FOR PATTERNED MASTER CARRIER FOR MAGNETIC TRANSFER, AND METHOD FOR PRODUCING PERFORMATTED MAGNETIC RECORDING MEDIA

(75) Inventors: Toshihiro Usa, Odawara (JP); Kazunori Komatsu, Odawara (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/170,141

(22) Filed: Jun. 30, 2005

(65) Prior Publication Data

US 2006/0017020 A1  Jan. 26, 2006

(30) Foreign Application Priority Data

| Jun. 30, 2004 | (JP) | ............................. 2004-192701 |
| Jun. 30, 2004 | (JP) | ............................. 2004-192702 |
| Jul. 16, 2004 | (JP) | ............................. 2004-209928 |

(51) Int. Cl.
*G03C 5/00* (2006.01)
*G11B 7/00* (2006.01)

(52) U.S. Cl. ................... 430/296; 430/942; 369/44.13; 369/101

(58) Field of Classification Search ................ 430/296, 430/942; 369/44.13, 101
See application file for complete search history.

(56) References Cited

U.S. PATENT DOCUMENTS

| 6,735,163 B2 * | 5/2004 | Marshall ..................... 369/126 |
| 6,930,961 B2 * | 8/2005 | Wada ....................... 369/44.13 |
| 6,930,971 B2 * | 8/2005 | Marshall ...................... 369/101 |
| 7,026,098 B2 * | 4/2006 | Komatsu et al. ............ 430/296 |
| 2002/0186632 A1 | 12/2002 | Kumasaka et al. |
| 2004/0057158 A1 | 3/2004 | Usa et al. |
| 2004/0240366 A1 * | 12/2004 | Tomita .................... 369/59.25 |

FOREIGN PATENT DOCUMENTS

| EP | 1-267-340 A2 | 12/2002 |
| JP | 10-40544 A | 2/1998 |
| JP | 10-269566 A | 10/1998 |
| JP | 2000-207738 A | 7/2000 |
| JP | 2001-110050 A | 4/2001 |
| JP | 2001-256644 A | 9/2001 |

* cited by examiner

*Primary Examiner*—Christopher G. Young
(74) *Attorney, Agent, or Firm*—Sughrue Mion, PLLC

(57) ABSTRACT

A fine pattern having first elements within track widths and second elements, which are shifted half a track pitch from the first elements, are drawn across the entire surface of a disk accurately and at high speed. A transfer pattern for a magnetic transfer master carrier is drawn by scanning an electron beam on a disk coated with resist. The first elements and the second elements, which are shifted half a track pitch such that they straddle adjacent tracks, are drawn. While the disk is rotated unidirectionally, the electron beam is deflected in the radial direction within a single track of the disk to draw the first elements. Deflection of the electron beam in the radial direction is shifted half a track, to draw the second elements that straddle adjacent tracks at the same time.

20 Claims, 9 Drawing Sheets

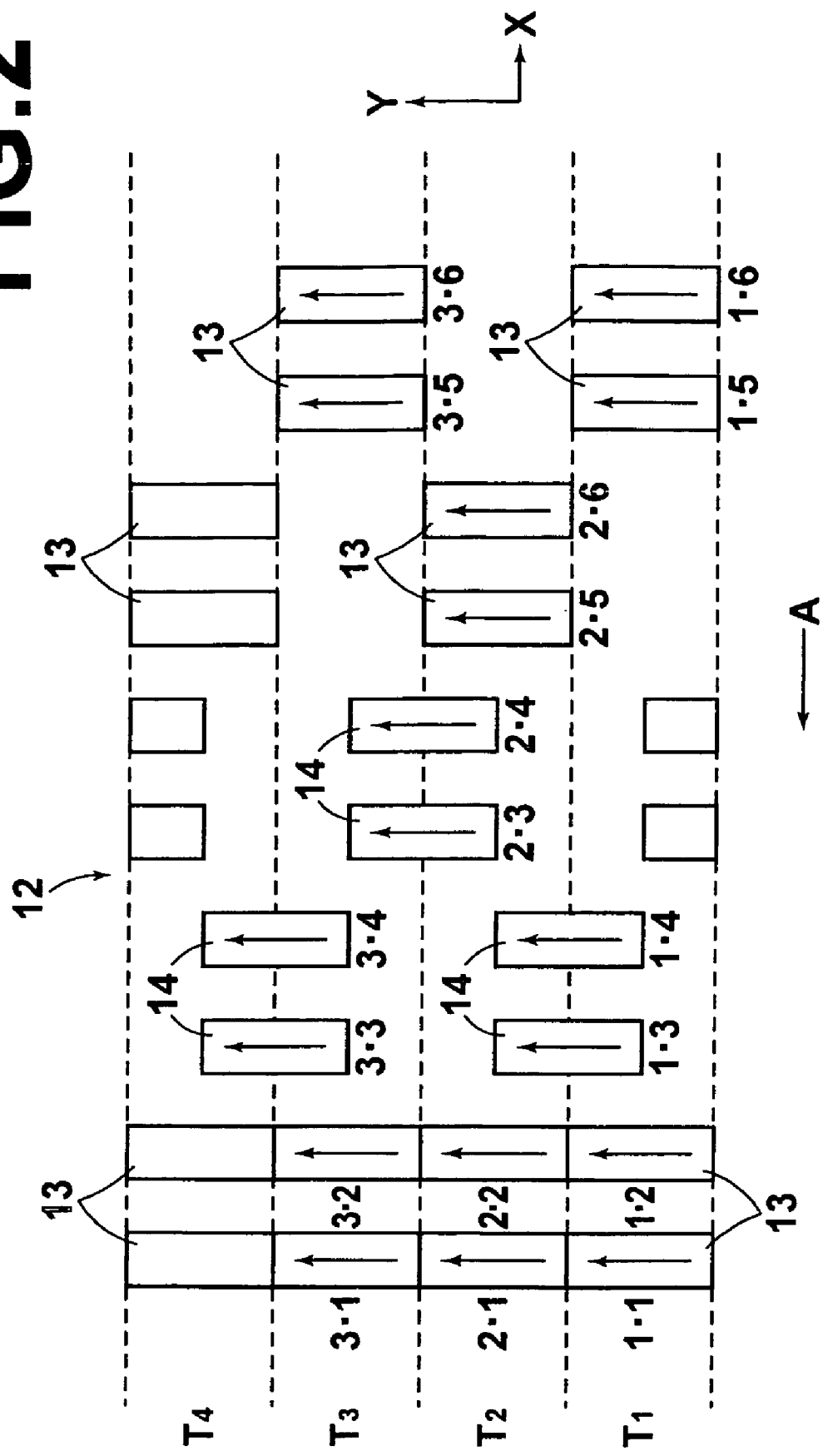

Y DIRECTION VOLTAGE

X DIRECTION VOLTAGE

BLK

ELECTRON BEAM LITHOGRAPHY METHOD, PATTERNED MASTER CARRIER FOR MAGNETIC TRANSFER, LITHOGRAPHY METHOD FOR PATTERNED MASTER CARRIER FOR MAGNETIC TRANSFER, AND METHOD FOR PRODUCING PERFORMATTED MAGNETIC RECORDING MEDIA

BACKGROUND OF THE INVENTION

1. Field of the Invention

The present invention relates to an electron beam lithography method, for drawing and exposing elements that constitute an uneven transfer pattern on a master carrier for magnetic transfer, by irradiating an electron beam on a resist provided on a disk.

The present invention also relates to a patterned master for magnetic transfer, having a transfer pattern that corresponds to an amplitude servo pattern constituted by amplitude servo signals.

Further, the present invention relates to a lithography method, for drawing and exposing elements that constitute the transfer pattern on the patterned master carrier for magnetic transfer, by irradiating an electron beam on a resist provided on a disk.

Still further, the present invention relates to a preformatted magnetic recording medium.

2. Description of the Related Art

Accompanying increases in amounts of data, magnetic recording media, which have high capacity, are inexpensive, and preferably enable readout of necessary portions in a short time, that is, capable of so-called high speed access, are desired. Various types of high density magnetic recording media are known. The data recording regions of the high density magnetic recording media are constituted by narrow tracks. Tracking servo technology plays a large role in enabling magnetic heads to scan the narrow tracks to reproduce signals with high S/N ratios. A sector servo technique is commonly employed to perform tracking servo.

The sector servo technique is a technique for causing magnetic heads to correct their positions. In the sector servo technique, servo data, such as servo signals, track address data signals, and reproduction clock signals, are recorded in servo fields. The servo fields are provided regularly at predetermined angles on data surfaces of magnetic recording media, such as magnetic disk media. Magnetic heads scan the servo fields and read out the servo data, to confirm and correct their positions.

A technique that employs reproduction amplitude data of servo signals is commonly applied to servo signals for track positioning. A common servo pattern comprises servo signals in A, B, C, and D burst portions. Each bit of A burst bit strings and B burst bit strings that constitute the A burst portion and the B burst portion is recorded at positions shifted one half of a track width from the center line of a track. When a reproducing magnetic head passes the servo field, positioning servo is applied such that the reproduction signal amplitude of the A and B burst bit strings are the same.

It is necessary for servo data to be recorded on magnetic recording media as preformatting during production thereof. Presently, preformatting is performed by dedicated servo recording apparatuses. The servo recording apparatuses are equipped with magnetic heads having head widths of approximately 75% of a track pitch, for example. A disk is rotated in a state in which a magnetic head of a servo recording apparatus is in close proximity thereto, and servo signals are recorded by moving the magnetic head from the outer periphery to the inner periphery of the disk every ½ tracks. Therefore, a long amount of time is required to preformat a single disk, which is a problem from the viewpoint or production efficiency.

Meanwhile, a method for accurately and efficiently preformatting magnetic recording media has been proposed in Japanese-Unexamined Patent Publication Nos. 10(1998)-040544 and 10(1998)-269566. This method transfers patterns, which are formed on master carriers and bear servo data, to magnetic recording media by magnetic transfer.

Magnetic transfer employs patterned master carriers, which have transfer patterns constituted by uneven patterns that correspond to data to be transferred, to magnetic recording media (slave media), such as magnetic disk media. The master carriers and slave media are placed in close contact, then transfer magnetic fields are applied thereto. Thereby, magnetic patterns that correspond to data (servo signals, for example) borne by the uneven patterns of the master carriers are magnetically transferred to the slave media. Magnetic transfer is advantageous in that: recording can be performed statically, without changing the relative positions of the master carriers and the slave media; accurate preformatting is enabled; and the amount of time required for recording is extremely short.

As a method to produce master carriers, which are utilized in magnetic transfer, an application of an optical disk stamper production method is being considered (refer to Japanese Unexamined Patent Publication No. 2001-256644, for example). The optical disk stamper production method uses an original disk, having an uneven pattern formed of resist that corresponds to data to be transferred, as a base. During production of the optical disk stamper, a disk (a glass plate, for example) having resist coated thereon is rotated. Data is converted to lengths of pits, and data is written into the resist by emitting laser beams, which are modulated according to the lengths of pits, onto the resist.

It is considered that drawing of the fine patterns onto master carriers for magnetic transfer may also be performed by rotating a disk having resist coated thereon and emitting a laser beam modulated according to data to be transferred, similar to the production method for the optical disk stamper.

However, miniaturization and increase of data capacity are desired in magnetic disk media. If bit lengths or track widths are decreased to accommodate increases in recording density (for example, if bit lengths or track widths become 0.3 µm or less), the decreased sizes approach the drawing limits of laser beams. Therefore, the shapes of the ends of drawn portions become arcuate, causing difficulty in forming rectangular elements of the uneven patterns. The shapes of the elements that constitute the uneven patterns of master carriers, and particularly the shapes of the upper surfaces of the elements, are those of the drawn portions. Therefore, if the ends of the drawn portions are arcuate, the upper surfaces of the protrusions of the uneven patterns on the master carrier substrate become shapes different from rectangles, such as ovals. In these cases, it becomes difficult to form desired magnetic patterns on slave media.

Meanwhile, in the field of semiconductors, patterning is already being performed by utilizing electron beams, which are capable of exposure with smaller diameter spots than laser beams. By utilizing the electron beams, it is becoming possible to perform highly accurate patterning of fine patterns.

In addition, patterned exposure using electron beams has been proposed in Japanese Unexamined Patent Publication No. 2001-110050. The patterned exposure using electron beams has been proposed to produce miniature, light weight and high recording density magnetic patterned media, the realization of which is being anticipated.

Accompanying the narrowing of track widths to accommodate increases in recording capacities of magnetic recording media, the accuracy in forming amplitude servo patterns thereon becomes an important factor, from the viewpoint of securing tracking performance of magnetic heads.

Specifically, fine structural elements of a servo pattern may be drawn on an enlarged recording surface during a design step. In actuality, however, the fine elements are drawn by deflecting and irradiating an electron beam on a resist surface of an original size. Therefore, it is difficult to draw the elements according to the designs thereof.

Patterned master carriers have been produced, based on servo patterns drawn by electron beams. These master carriers have been employed to record amplitude servo patterns onto magnetic recording media as magnetic patterns. When these magnetic recording media are actually loaded into drives to perform recording and reproduction, however, there are cases in which the exhibited tracking performance, that is, heads accurately following tracks, falls short of design parameters.

Basically, if production accuracy of servo patterns is low, positioning servo accuracy is also decreased. There are cases in which heads are unable to scan the positions of designed tracks, and scan outside the tracks. However, in practice, it is impossible to form all of the elements of servo patterns with high accuracy. Therefore, it is necessary to study what degree of accuracy is required to secure tracking performance, and to form servo patterns at a level of accuracy that does not pose actual problems in servo positioning.

It is also necessary to investigate drawing methods for the servo pattern that secures the desired level of accuracy.

Servo signals include, for example: a preamble (synchronization signal), which is recorded across an entire track width; gray codes (track number discriminating signals); and burst signals, which are recorded in halves of the track widths, for positioning heads. Transfer patterns (uneven patterns formed in magnetic material), which are formed on the magnetic transfer master carriers to transfer and record the servo signals correspond to the servo signals. That is, the transfer patterns comprise: first elements, which are protrusions formed across the entire track width; and second elements, which are protrusions formed at positions shifted half a track pitch from the first elements so as to straddle two adjacent tracks (or protrusions which are formed across half the track width). It is necessary to draw each element in resists, which are coated on disks, efficiently and accurately by use of electron beams.

The amplitude servo pattern described above is illustrated in the figures of Japanese Unexamined Patent Publication Nos. 10(1998)-040544 and 10(1998)-269566. As illustrated in the figures, the amplitude servo pattern comprises servo burst signals constituted burst bit strings. The burst bit strings are provided in different tracks and adjacent to each other in the track width direction, with intervals of approximately one track width therebetween. The burst bit strings include those which are formed across substantially the entire track width with the center of the track in the track width direction as their centers, and those which are formed from the central portion of a track to the central portion of an adjacent track so as to straddle the two tracks. An electron beam is deflected to draw burst bit strings on adjacent tracks, and also deflected to draw elements, which are shifted a half a track from other elements. It has been found that accuracy in these deflection operations is important in securing servo positioning.

Particularly in the production of the aforementioned master carrier for magnetic transfer, it is necessary to perform patterning concentrically or in a spiral. Therefore, favorable pattern formation is difficult, in the case that an electron beam lithography method that employs an XY stage, as in the field of semiconductors, is adopted. Accordingly, a lithography method, which is capable of drawing favorable patterns, is desired. In particular, the aforementioned second elements, which are shifted half a track pitch from the tracks (or only formed across half the tracks) cannot be drawn in a manner similar to that for drawing the first elements, and therefore, innovations are required. Accompanying increases in the numbers of tracks (numbers of sectors), the number of elements also becomes enormous. Thus, reductions in drawing times, by improvements in drawing speeds, as well as improvements in the shapes and positional accuracy of drawn elements across the entire surfaces of disks, are desired.

SUMMARY OF THE INVENTION

The present invention has been developed in view of the above circumstances. It is an object of the present invention to provide an electron beam lithography method which is capable of drawing fine patterns comprising: first elements having widths equal to track widths; and second elements, which are shifted half a track pitch from the tracks (or only formed across half the tracks), highly accurately and at high speeds.

It is another object of the present invention to provide a patterned master carrier for magnetic transfer having an amplitude servo pattern, of which elements are specified and defined to an accuracy that enables desired servo positioning.

It is yet another object of the present invention to provide a lithography method for producing the above patterned master carrier for magnetic transfer.

It is a further object of the present invention to provide a method of producing a preformatted magnetic recording medium.

The first electron beam lithography method of the present invention is an electron beam lithography method, for drawing elements that constitute a transfer pattern of a magnetic transfer master carrier, by scanning an electron beam on a disk having resist coated thereon, placed on a rotatable stage which is also movable in the radial direction, while rotating the rotatable stage;

the transfer pattern comprising:

first elements, which are arranged within track widths of circumferential tracks within transfer regions at each sector thereof; and second elements, which are arranged shifted a half track width from the tracks, to straddle two adjacent tracks;

the electron beam lithography method comprising the steps of:

unidirectionally rotating the disk;

deflecting the electron beam in the radial direction within a single track of the disk; and scanning the electron beam so as to fill in the shapes of the first elements of the track to draw the first elements, simultaneously deflecting the electron beam a half track width with respect to the drawing position of the first elements and scanning the electron beam so as to fill in the shapes of the second elements, which straddle adjacent tracks, to draw the second elements.

In the first electron beam lithography method of the present invention, it is preferable that the drawing lengths of the elements in the circumferential direction are defined by the amplitude of high speed reciprocal oscillation of the electron beam in the circumferential direction, which is substantially perpendicular to the radial direction of the disk.

It is also preferable that the transfer pattern is drawn across the entire surface of the disk, by shifting the relative position of the electron beam with respect to the disk in the radial direction thereof following completion of lithography of the elements of a single track or of a plurality of tracks.

The first electron beam lithography method of the present invention is favorably applied in cases in which the transfer pattern is a servo pattern that includes burst portions.

The second electron beam lithography method of the present invention is an electron beam lithography method, for drawing elements that constitute a transfer pattern of a magnetic transfer master carrier, by scanning an electron beam emitted by an electron beam lithography apparatus on a disk having resist coated thereon, placed on a rotatable stage which is also movable in the radial direction, while rotating the rotatable stage;

the transfer pattern comprising:

first elements, which are arranged within track widths of circumferential tracks within transfer regions at each sector thereof; and second elements, which are provided within half track widths of the tracks;

the electron beam lithography apparatus comprising:

deflecting means, for deflecting the emitted electron beam in the radial direction of the disk; and blanking means, for shielding irradiation of the electron beam onto portions other than drawing portions;

the electron beam lithography method comprising the steps of:

unidirectionally rotating the disk;

deflecting the electron beam in the radial direction one track width at a time with the deflecting means, to draw the first and second elements of each track within a single rotation of the disk;

the first elements being drawn by irradiating the electron beam of a deflection amount that corresponds to the track width; and the second elements being drawn by shielding irradiation of the electron beam of a deflection amount that corresponds to half the track width, while irradiating the electron beam of a deflection amount that corresponds to the other half of the track width.

The third electron beam lithography method of the present invention is an electron beam lithography method, for drawing elements that constitute a transfer pattern of a magnetic transfer master carrier, by scanning an electron beam emitted by an electron beam lithography apparatus on a disk having resist coated thereon, placed on a rotatable stage which is also movable in the radial direction, while rotating the rotatable stage;

the transfer pattern comprising:

first elements, which are arranged within track widths of circumferential tracks within transfer regions at each sector thereof; and second elements, which are provided within half track widths of the tracks;

the electron beam lithography apparatus comprising:

deflecting means, for deflecting the emitted electron beam in the radial direction of the disk; and blanking means, for shielding irradiation of the electron beam onto portions other than drawing portions;

the electron beam lithography method comprising the steps of:

unidirectionally rotating the disk;

deflecting the electron beam in the radial direction one half track width at a time with the deflecting means, to draw the first and second elements of each track in one half of the tracks at a time;

half of the first elements and the second elements positioned in the half of the track being drawn during a first rotation to scan a single track; and the remaining half of the first elements and the second elements positioned in the other half of the track being drawn during a second rotation to scan the single track.

In the third electron beam lithography method of the present invention, it is preferable that the drawing lengths of the elements in the circumferential direction are defined by the amplitude of high speed reciprocal oscillation of the electron beam in the circumferential direction, which is substantially perpendicular to the radial direction of the disk.

The third electron beam lithography method of the present invention is favorably applied to cases in which the transfer pattern is a servo pattern that includes burst portions.

Note that the "elements that constitute a transfer pattern" are recording elements, which are formed to record signals that correspond to data in tracks. The elements are generally parallelograms, which include rectangular shapes, and are surrounded by sides, which are parallel to the track direction, and sides, which intersect the track direction either perpendicularly or at an angle.

An electron beam lithography apparatus for executing the lithography methods of the present invention may be that which comprises: a rotatable stage, for rotatably holding a disk; a mechanism for linearly moving the rotatable stage; means for drive controlling the rotational speed of the rotatable stage and the linear motion thereof; an electron beam emitting means, for generating and emitting electron beams; blanking means, for switching the irradiation of electron beams on/off; deflecting means, for deflecting electron beams in the circumferential and radial directions; means for transmitting lithography data signals that cause electron beams to be scanned according to each element of a pattern; and control means for coordinating and controlling the operations of the aforementioned components.

The first patterned master carrier for magnetic transfer of the present invention is a patterned master carrier for magnetic transfer, having a transfer pattern of protrusions and recesses, the transfer pattern comprising:

a plurality of tracks, which are formed at equidistant track pitches; and an amplitude servo pattern constituted by A burst portions and B burst portions, which are recorded on alternate tracks from the central portion of a track to the central portion of an adjacent track so as to straddle the tracks; and C burst portions and D burst portions, which are recorded on alternate tracks with the centers of track widths as their centers so as to be recorded across the track widths; the A, B, C, and D burst portions being arranged in the track direction;

the accuracy of the amplitude servo pattern being defined such that at least 80% of measured values of distances between the centers in a track width direction of burst portions, which are positioned such that they are shifted one track in the track width direction, from among the A, B, C, and D burst portions are within a range of ±10% of the track pitch.

The second patterned master carrier for magnetic transfer of the present invention is a patterned master carrier for magnetic transfer, having a transfer pattern of protrusions and recesses, the transfer pattern comprising:

a plurality of tracks, which are formed at equidistant track pitches; and an amplitude servo pattern constituted by A burst portions and B burst portions, which are recorded on alternate tracks from the central portion of a track to the central portion of an adjacent track so as to straddle the tracks; and C burst portions and D burst portions, which are recorded on alternate tracks with the centers of track widths as their centers so as to be recorded across the track widths; the A, B, C, and D burst portions being arranged in the track direction;

the accuracy of the amplitude servo pattern being defined such that at least 80% of measured values of distances between the centers in a track width direction of burst portions, which are positioned such that they are shifted one half of a track in the track width direction, from among the A, B, C, and D burst portions are within a range of ±10% of one half of the track pitch.

In the first and second patterned master carriers for magnetic transfer of the present invention, it is preferable that the accuracy of the amplitude servo pattern is defined such that the lengths of the A, B, C, and D burst portions in the track width direction are within a range of 90% to 120% of the track pitch.

The first lithography method for patterned master carriers of the present invention is a lithography method, for drawing a transfer pattern bearing an amplitude servo pattern that has servo burst signals constituted by A, B, C, and D burst portions on a patterned master carrier for magnetic transfer, by scanning an electron beam on a disk having resist coated thereon, placed on a rotatable stage, while rotating the rotatable stage;

one of the A burst portions and the B burst portions, which are recorded on alternate tracks from the central portion of a track to the central portion of an adjacent track so as to straddle the tracks, and one of the C burst portions and D burst portions, which are recorded on alternate tracks with the centers of track widths as their centers so as to be recorded across the track widths, being drawn within a single rotation of the disk; and control signals, for deflecting the electron beam in the track width direction one track pitch to change a drawing base position to draw a next track, and control signals, for deflecting the electron beam in the track width direction for the lengths of the burst portions in the track width direction, being adjusted and controlled independently.

In the first lithography method for patterned master carriers of the present invention, it is preferable that control signals, for deflecting the electron beam one track pitch in the track width direction to draw a next track, are adjusted and controlled according to an amount, by which measured values of distances between the centers in a track width direction of burst portions, which are positioned such that they are shifted one track in the track width direction, from among the A, B, C, and D burst portions, differ from a set value for the track pitch.

The second lithography method for patterned master carriers of the present invention is a lithography method, for drawing a transfer pattern bearing an amplitude servo pattern that has servo burst signals constituted by A, B, C, and D burst portions on a patterned master carrier for magnetic transfer, by scanning an electron beam on a disk having resist coated thereon, placed on a rotatable stage, while rotating the rotatable stage;

one of the A burst portions and the B burst portions, which are recorded on alternate tracks from the central portion of a track to the central portion of an adjacent track so as to straddle the tracks, and one of the C burst portions and D burst portions, which are recorded on alternate tracks with the centers of track widths as their centers so as to be recorded across the track widths, being drawn within a single rotation of the disk; and control signals, for deflecting the electron beam in the track width direction one half of a track pitch to change a drawing base position from that for drawing the A burst portions or the B burst portions to that for drawing the C burst portions or the D burst portions within a single rotation of the disk, and control signals, for deflecting the electron beam in the track width direction for the lengths of the burst portions in the track width direction within a single rotation of the disk, being adjusted and controlled independently.

In the second lithography method for patterned master carriers of the present invention, it is preferable that control signals, for deflecting the electron beam to change a drawing base position from that for drawing the A burst portions or the B burst portions to that for drawing the C burst portions or the D burst portions within a single rotation of the disk, are adjusted and controlled according to an amount, by which measured values of distances between the centers in a track width direction of burst portions, which are positioned such that they are shifted one track in the track width direction, from among the A, B, C, and D burst portions, differ from one half of a set value for the track pitch.

In the second lithography method for patterned master carriers of the present invention, it is also preferable that drawing phase shift control signals, for deflecting the electron beam in the track direction, are controlled simultaneously and separately from the control signals, for deflecting the electron beam to change a drawing base position from that for drawing the A burst portions or the B burst portions to that for drawing the C burst portions or the D burst portions within a single rotation of the disk.

The method for producing preformatted magnetic recording media of the present invention comprises the steps of:

placing either of the patterned master carriers for magnetic transfer of the present invention in close contact with a magnetic recording medium, to form a conjoined body; and applying a transfer magnetic field to the conjoined body, to transfer the amplitude servo pattern onto the magnetic recording medium.

In the first electron beam lithography method of the present invention, the electron beam is deflected in the radial direction while the disk is unidirectionally rotated. Simultaneously with the drawing of the track width first elements, the deflection of the electron beam in the radial direction is shifted half a track, to draw the second elements that straddle an adjacent track. Thereby, the first elements and the second elements, which are shifted half a track pitch, can be drawn at once. Therefore, highly accurate and high speed drawing of the fine pattern across the entire surface of the disk is enabled. Accordingly, the drawing efficiency is improved, and the drawing time can be shortened.

In the second electron beam lithography method of the present invention, the electron beam is deflected in the radial direction while the disk is unidirectionally rotated. Simultaneously with the drawing of the first elements, the blanking means shields irradiation of the electron beam on half of a track, to draw the second elements continuously with the first elements. Thereby, the first elements and half track portions of the second elements can be drawn at once. Therefore, highly accurate and high speed drawing of the fine pattern across the entire surface of the disk is enabled. Accordingly, the drawing efficiency is improved, and the drawing time can be shortened.

In the third electron beam lithography method of the present invention, the electron beam is deflected in the radial direction while the disk is unidirectionally rotated. Halves of the first elements and the second elements are drawn one half of a track during each rotation, by employing the blanking means. Therefore, the number of rotations necessary to draw the elements is doubled. However, control of deflection amounts in the radial direction to draw the second elements is simplified.

The first patterned master carrier for magnetic transfer bears an amplitude servo pattern including servo burst signals, in the form of an uneven transfer pattern thereon. The accuracy of the amplitude servo pattern is defined such that at least 80% of measured values of distances between the centers in a track width direction of burst portions, which are positioned such that they are shifted one track in the track width direction, from among the A, B, C, and D burst portions are within a range of ±10% of the track pitch. Therefore, the first patterned master carrier of the present invention enables transfer of accurate servo patterns on magnetic recording media. The accurate servo patterns enable heads to be scanned at predetermined positions within tracks, thereby improving the reliability of positional control. Accordingly, uniform tracking can be obtained along the circumferential direction of the tracks, and the trajectories of heads can be stabilized between adjacent tracks.

The second patterned master carrier for magnetic transfer bears an amplitude servo pattern including servo burst signals, in the form of an uneven transfer pattern thereon. The accuracy of the amplitude servo pattern being defined such that at least 80% of measured values of distances between the centers in a track width direction of burst portions, which are positioned such that they are shifted one half of a track in the track width direction, from among the A, B, C, and D burst portions are within a range of ±10% of one half of the track pitch. Therefore, the second patterned master carrier of the present invention enables transfer of accurate servo patterns on magnetic recording media. The accurate servo patterns enable heads to be scanned at predetermined positions within tracks, thereby improving the reliability of positional control. Accordingly, uniform tracking can be obtained along the circumferential direction of the tracks, and the trajectories of heads can be stabilized between adjacent tracks.

In the first and second patterned master carriers of the present invention, the accuracy of the amplitude servo pattern may be defined such that the lengths of the A, B, C, and D burst portions in the track width direction are within a range of 90% to 120% of the track pitch. In this case, servo positioning can be performed with favorable tracking control. If the lengths of the burst portions in the track width direction are less than 90% of the track pitch, the signals received by heads is weak, thereby causing the head to wander. If the lengths of the burst portions in the track width direction are greater than 120% of the track pitch, the outputs thereof exceed half of the tracks, thereby endangering tracking performance and decreasing reliability.

Meanwhile, the first lithography for patterned master carriers of the present invention draws one of the A burst portions and the B burst portions and one of the C burst portions and the D burst portions simultaneously in a single rotation of the disk. Control signals, for deflecting the electron beam in the track width direction one track pitch to change a drawing base position to draw a next track, and control signals, for deflecting the electron beam in the track width direction for the lengths of the burst portions in the track width direction, are adjusted and controlled independently. Therefore, the positional accuracy of the transfer pattern is improved. Accordingly, amplitude servo patterns that enable highly reliable servo positioning can be drawn.

In the first lithography method for patterned master carriers of the present invention, control signals, for deflecting the electron beam one track pitch in the track width direction to draw a next track, may be adjusted and controlled according to an amount, by which measured values of distances between the centers in a track width direction of burst portions, which are positioned such that they are shifted one track in the track width direction, from among the A, B, C, and D burst portions, differ from a set value for the track pitch. In this case, adjustment and control of the positional accuracy of the pattern is facilitated, and accurate amplitude servo patterns can be drawn.

The second lithography method for patterned master carriers of the present invention draws one of the A burst portions and the B burst portions and one of the C burst portions and the D burst portions simultaneously in a single rotation of the disk. Control signals, for deflecting the electron beam in the track width direction one half of a track pitch to change a drawing base position from that for drawing the A burst portions or the B burst portions to that for drawing the C burst portions or the D burst portions within a single rotation of the disk, and control signals, for deflecting the electron beam in the track width direction for the lengths of the burst portions in the track width direction within a single rotation of the disk, are adjusted and controlled independently. Therefore, the positional accuracy of the transfer pattern is improved. Accordingly, amplitude servo patterns that enable highly reliable servo positioning can be drawn.

In the second lithography method for patterned master carriers of the present invention, control signals, for deflecting the electron beam to change a drawing base position one half of a track pitch from that for drawing the A burst portions or the B burst portions to that for drawing the C burst portions or the D burst portions within a single rotation of the disk, may be adjusted and controlled according to an amount, by which measured values of distances between the centers in a track width direction of burst portions, which are positioned such that they are shifted one half of a track in the track width direction, from among the A, B, C, and D burst portions, differ from one half of a set value for the track pitch. In this case, adjustment and control of the positional accuracy of the pattern is facilitated, and accurate amplitude servo patterns can be drawn.

Further, in the second lithography method for patterned master carriers of the present invention, drawing phase shift control signals, for deflecting the electron beam in the track direction, may be controlled simultaneously and separately from the control signals, for deflecting the electron beam to change a drawing base position one half of a track pitch from that for drawing the A burst portions or the B burst portions to that for drawing the C burst portions or the D burst portions within a single rotation of the disk. In this case, shifting of the positions of each of the burst portions in the track direction can be prevented, and positional accuracy of the pattern during lithography is facilitated.

The method for producing preformatted magnetic recording media of the present invention places a patterned master carrier for magnetic transfer having predetermined accuracy properties into close contact with a magnetic recording medium, to form a conjoined body. Then, a transfer magnetic field is applied to the conjoined body to record amplitude servo patterns on the magnetic recording medium. Therefore, transfer and recording of accurate amplitude servo patterns is facilitated and enabled to be performed in a short amount of time.

BRIEF DESCRIPTION OF THE DRAWINGS

FIG. 2 is an enlarged schematic view that illustrates a drawing order for servo patterns.

DESCRIPTION OF THE PREFERRED EMBODIMENTS

Hereinafter, embodiments of the present invention will be described in detail, with reference to the attached drawings.

Figure 1A:
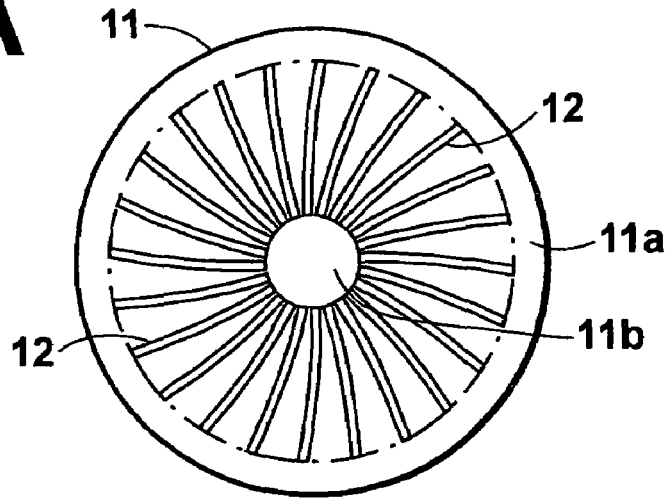
FIG. 1A is a plan view of a transfer pattern to be drawn on a master carrier for magnetic transfer by the electron beam lithography method of the present invention.
Figure 1B:
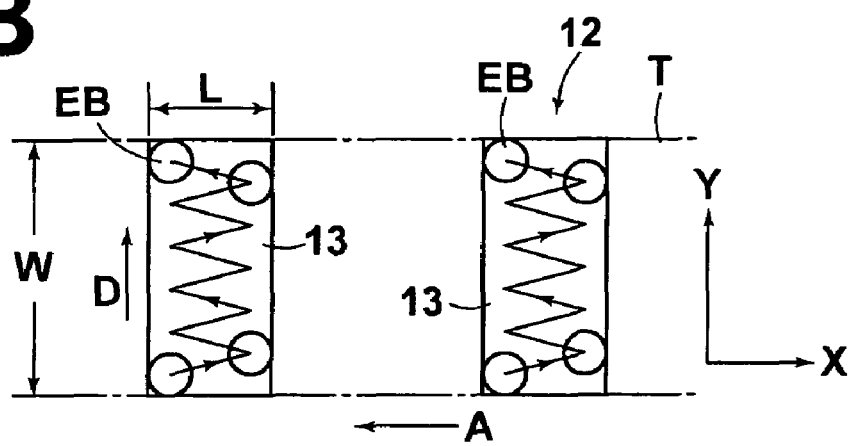
FIG. 1B is an enlarged schematic view of a basic lithography method for drawing elements that constitute the transfer pattern.
Figure 3A:
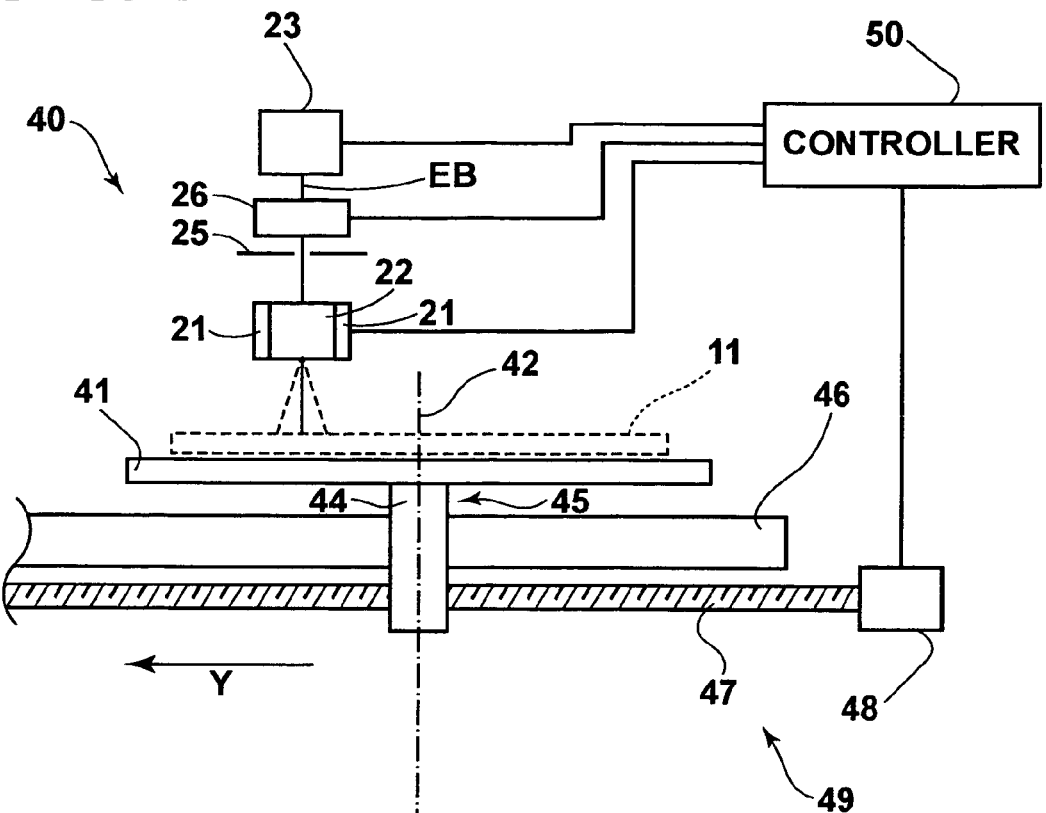
FIG. 3A is a side view of the main parts of an embodiment of the electron beam lithography apparatus for executing the electron beam lithography method of the present invention.
Figure 3B:
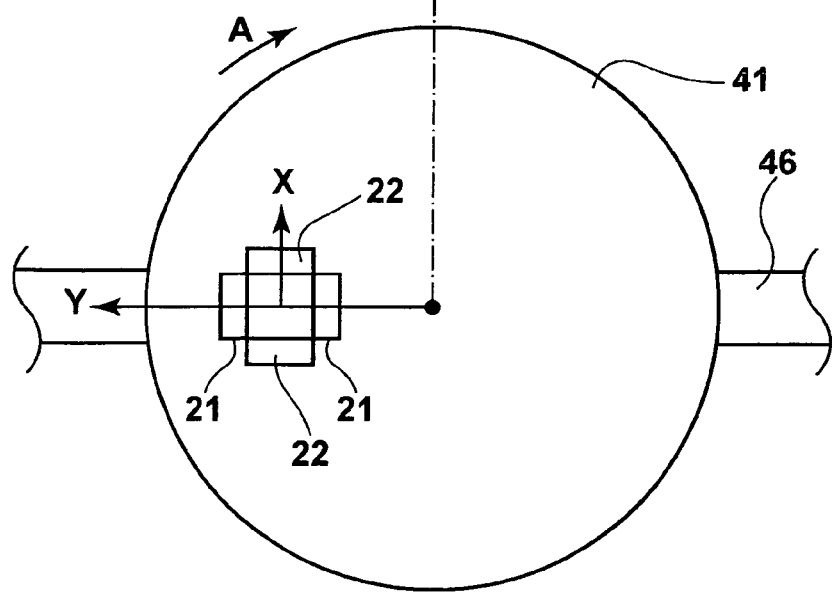
FIG. 3B is a plan view of the electron beam lithography apparatus.

First, a first embodiment of the electron beam lithography method of the present invention will be described. FIG. 1A is a plan view of a transfer pattern to be drawn on a master carrier for magnetic transfer by the electron beam lithography method of the present invention. FIG. 1B is an enlarged schematic view of a basic lithography method for drawing elements that constitute the transfer pattern. FIG. 2 is an enlarged schematic view that illustrates a drawing order for servo patterns. FIG. 3A is a side view of the main parts of an embodiment of the electron beam lithography apparatus for executing the electron beam lithography method of the present invention. FIG. 3B is a plan view of the electron beam lithography apparatus.

As illustrated in FIG. 1A, a transfer pattern 12 (servo pattern) constituted by fine protrusions and recesses, which is formed on a master carrier for magnetic transfer, is formed in an annular region of a disk 11 (discoid substrate) that excludes an outer peripheral portion 11a and an inner peripheral portion 11b. The pattern 12 in FIG. 1A illustrates a case in which transfer data is servo signals. The servo signals are formed in thin regions that extend substantially radially from the central portion of the disk 11, such that they are positioned at equidistant intervals along concentric tracks of the disk 11 and within transfer regions of each sector. Note that in the servo pattern 12 of this example, the servo signals are formed in arcuate radial regions, which are continuous in the radial direction.

FIG. 1B and FIG. 2 are enlarged views of a portion of the pattern 12. As illustrated in FIG. 1B and FIG. 2, first fine elements 13 and second fine elements 14 (refer to FIG. 2) that correspond to data to be transferred are provided in concentric tracks T. The pattern 12 is constituted by clusters of these elements. The first elements 13 are rectangles having widths W that correspond to the track width, and circumferential lengths (bit lengths) of L. The second elements 14 are also rectangles having widths W and circumferential lengths of L. However, the second elements 14 are shifted one half of a track from the first elements 13, so as to straddle adjacent tracks. The elements 13 and 14 will become protrusions (or recesses) in a final master carrier, and other portions will become flat portions.

As illustrated in FIG. 2, the servo pattern 12 comprises the first elements 13, which are recorded across the entire track width W. The first elements 13 transfer: preambles (synchronization signals); gray codes (ID signals, such as track numbers); and portions of burst signals, for positioning heads. The second elements 14, which are shifted one half of a track pitch from the first elements 13, transfer portions of burst signals for positioning heads.

Lithography of each of the elements 13 and 14 of the pattern 12 is performed by placing the disk 11, which has resist coated on the surface thereof, on a rotatable stage 41 (refer to FIGS. 3A and 3B) and rotating the stage 41. While the disk 11 is being rotated, an electron beam EB scans the elements 13 and 14 to irradiate and expose the resist one track at a time, from the inner tracks toward the outer tracks, or in the opposite direction.

The basic manner in which the electron beam lithography method of the present invention is realized will be described. As illustrated in FIG. 1B, the fine diameter electron beam EB continuously scans the shapes of the first elements 13 and the second elements 14, which are shifted one half of a track in the radial direction, so as to fill in the shapes, while the disk 11 is rotated in direction A. Scanning is performed at predetermined phase positions of the concentric tracks T (track width: W), which extend in a circumferential direction X perpendicular to a radial direction Y, when viewed microscopically.

The scanning is performed by emitting the electron beam EB, which has a smaller beam diameter than the minimum width of the elements 13 and 14. The electron beam EB is reciprocally oscillated at high speed in the circumferential direction X, which is substantially perpendicular to the radial direction Y. The electron beam EB is also deflected in the radial direction Y, to perform deflection D. Thereby, the electron beam EB scans the shapes of the first elements 13 with a triangular wave trajectory, so as to fill in the shapes. Further, the center of the deflection D is shifted half a track, by overlaying a Y direction deflection voltage for half a track. Then, the electron beam EB scans the shapes of the second elements 14, which straddle adjacent tracks, with a triangular wave trajectory, so as to fill in the shapes. In this manner, the elements 13 and 14 are drawn sequentially. After a single track T is drawn in a single rotation, scanning is moved to a next track T, and lithography is performed in a similar manner. Thereby, a desired fine pattern 12 is drawn across the entire region of the disk 11.

FIG. 2 illustrates a drawing order of each element 13 and 14 of a plurality of tracks. First, the first and second elements 13 and 14 of track T1 are drawn in the order of 1-1 to 1-6, by setting the center of deflection in the Y direction to the center of the track T1. That is, the first elements 13 at the beginning of a sector are drawn first, at 1-1 and 1-2. Then, the center of deflection in the Y direction is shifted one half a track, and the two second elements 14 are drawn at 1-3 and 1-4. Thereafter, the center of deflection in the Y direction is returned to the center of the track T1, and the next two first elements 13 are drawn at 1-5 and 1-6.

In the next rotation, the center of deflection in the Y direction is set to the center of track T2, and the first elements 13 and the second elements 14 are drawn in a similar manner, in the order of 2-1 to 2-6. In the rotation after that, the center of deflection in the Y direction is set to the center of track T3, and the first elements 13 and the second elements 14 are drawn in a similar manner, in the order of 3-1 to 3-6.

Movement of the electron beam EB among the tracks is performed by linearly moving the rotatable stage 41 in the radial direction Y. This movement may be performed every time a track is drawn, or every time a plurality of tracks are drawn, depending on a deflectable range of the electron beam EB in the radial direction Y.

Note that the second elements 14, which have widths of half a track pitch, of the innermost and outermost tracks can be drawn by shielding a half track portion of the electron beam EB with an aperture 25 and a blank 26, to be described later.

In the case that the electron gun that emits the electron beam EB is of the fixed type, as will be described later, rotation of the rotatable stage 41 during lithography of a single rectangular element 13 or 14 will cause shifting in the drawing trajectory. In cases that the influence of this shifting cannot be ignored, it is necessary to perform the deflection D in the radial direction Y while deflecting the center of the reciprocal oscillation (in the X direction) of the electron beam EB in the rotating direction, according to the speed of rotation. On the other hand, there are cases in which the shapes of the elements 13 and 14 of the pattern 12 are not rectangular, but are parallelograms that are inclined with respect to the track direction. In these cases, the deflection D in the radial direction Y is performed while deflecting the center of the reciprocal oscillation of the electron beam EB according to the angle of inclination.

The drawing length L of the elements 13 and 14 in the circumferential direction X, is determined by the oscillation amplitude of the reciprocal oscillation of the electron beam EB in the circumferential direction X. In the case that the lengths L of the elements 13 and 14 in the circumferential direction X exceeds the oscillation amplitude of the electron beam EB, the elements are drawn in a plurality of drawing steps.

The rotating speed of the rotatable stage 41 is adjusted such that rotation is slower when lithography is being performed at the outer peripheral positions of the disk 11, and faster when lithography is being performed at the inner peripheral portions of the disk 11. This is to ensure that the linear speed of the electron beam EB is constant, regardless of the movement in the radial position of drawing portions within the drawing region of the disk 11, that is, movement of the electron beam EB among the tracks. This configuration is preferable, because the constant linear speed of the electron beam EB enables uniform exposure at all drawn portions of the disk, and also because accuracy in the drawing positions can also be improved.

The electron beam EB is scanned as described above, to draw the elements 13 and 14. Lithography data signals, for controlling scanning of the electron beam EB, are transmitted. The transmitted signals control timing and phase, based on reference clock signals, which are generated according to the rotating speed of the rotatable stage 41.

There are cases in which the recording method of the pattern 12 is the CAV (Constant Angluar Velocity) method. In these cases, the lengths of sectors are different between outer tracks and inner tracks. Therefore, the circumferential length L of the elements 13 and 14 are set to be greater at the outer tracks and smaller at the inner tracks. When drawing these elements 13 and 14, the speed of deflection D in the radial direction Y is changed such that it is slower at the outer tracks, and faster at the inner tracks. That is, the deflection speed is varied such that it is caused to be slower the further the drawing portion is from the rotational center of the disk 11. Thereby, the lithography area by the electron beam EB is caused to be uniform per unit time for each of the elements 13 and 14. Accordingly, exposure of the elements 13 and 14 can be performed evenly, under the same conditions. In other words, exposure can be performed under stable conditions, in which the frequency of reciprocal oscillation of the electron beam EB in the circumferential direction X and the electron beam intensity are uniform.

An electron beam lithography apparatus 40, such as that illustrated in FIGS. 3A and 3B, is utilized to perform lithography as described above. The electron beam lithography apparatus 40 comprises: a rotatable stage unit 45; a shaft 46; and a linear movement means 49. The rotatable stage unit 45 comprises: the rotatable stage 41 for holding the disk 11; a central shaft 42 of the rotatable stage 41; and a spindle motor 44, which has a motor shaft provided to match the central shaft 42 of the stage 41. The shaft 46 penetrates through a portion of the rotatable stage unit 45, and extends in the radial direction Y of the rotatable stage 41. The linear movement means 49 moves the rotatable stage unit 45 along the shaft 46. A rod 47, having fine threads engraved therein, is provided parallel to the shaft 46. The rod 47 is in threaded engagement with a portion of the rotatable stage unit 45. The rod 47 is rotated in two directions by a pulse motor 48. The linear movement means 49, for moving the rotatable stage unit 45, is constituted by the rod 47 and the pulse motor 48. In addition, means (not shown), for generating the reference clock signals corresponding to the rotation of the rotatable stage 41, is provided.

The electron beam lithography apparatus 40 further comprises: an electron gun 23, for emitting the electron beam EB; deflecting means 21 and 22, for deflecting the electron beam EB in the Y direction (radial direction of the disk) and in the X direction (circumferential direction) perpendicular to the Y direction; and the aperture member 25 and the blank 26 (deflector) that constitute the blanking means, for turning the irradiation of the electron beam EB ON/OFF. The electron beam EB, which is emitted from the electron gun 23, is irradiated onto the disk 11 via the deflecting means 21, 22, and lenses (not shown). Note that during pattern lithography, the deflecting means 21 and 22 are controlled to cause the electron beam EB to reciprocally oscillate in the circumferential direction X, at a uniform oscillation width.

The aperture member 25 of the blanking means is provided with a transparent aperture for the electron beam EB to pass through at its central portion. The blank 26 (deflector) does not deflect the electron beam EB, thereby causing it to pass through the transparent aperture of the aperture member 25 if an ON signal is input. On the other hand, if an OFF signal is input, the blank 26 deflects the electron beam EB so that it does not pass through the transparent aperture, but is shielded by the aperture member 25. When the elements 13 and 14 are being drawn, an ON signal is input to irradiate the electron beam EB, and an OFF signal is input when moving between the elements 13 and 14, to shield the electron beam EB such that exposure is not performed. The blanking means is employed to draw the first and second elements 13 and 14, as described above.

The driving of the spindle motor 44, that is, the rotating speed of the rotatable stage 41; the driving of the pulse motor 48, that is, the linear movement by the linear movement means 49; modulation of the electron beam EB; control of the deflecting means 21 and 22; and ON/OFF control of the blanking means is performed based on the reference clock signals, according to lithography data transmitted from a controller 50, which is a control means.

In the case that a concentric pattern is drawn, the rotatable stage 41 is moved linearly for a predetermined distance after each rotation of the rotatable stage. In the case that a spiral pattern is drawn, the rotatable stage is moved linearly substantially continuously.

The disk 11, which is placed on the rotatable stage 41, is formed of silicon, glass or quartz, and has a positive type electron beam lithography resist coated thereon in advance.

During lithography by the lithography apparatus 40, the disk 11 is rotated in direction A, and the Y direction and X direction deflecting means 21 and 22 are synchronized and controlled by a frequency function signal, such as triangular waveforms, to cause the electron beam EB to oscillate cyclically in a predetermined direction with a constant amplitude. As a result, the electron beam EB is scanned a plurality of times in the circumferential direction X of the elements 13 to draw their shapes. The pattern 12 is drawn by repeating the above. During lithography of the second elements 14, the drive voltage of the Y direction deflecting means 21 is overlaid a half track and applied, to shift the center of movement for the width W a half track toward the outer periphery. Thereby, the first and second elements 13 and 14 are drawn continuously within a single rotation of the disk 11.

Note that it is desirable for the output and beam diameter of the electron beam EB to be adjusted, taking into consideration the shapes of the elements 13 and the sensitivity of the electron beam lithography resist.

Figure 4A:
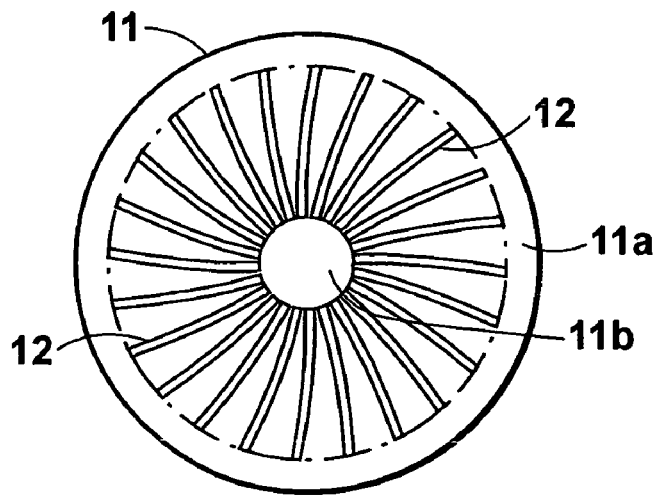
FIG. 4A is a plan view that illustrates a transfer pattern of a master carrier for magnetic transfer, which is drawn by the electron beam lithography method of the present invention.
Figure 4B:
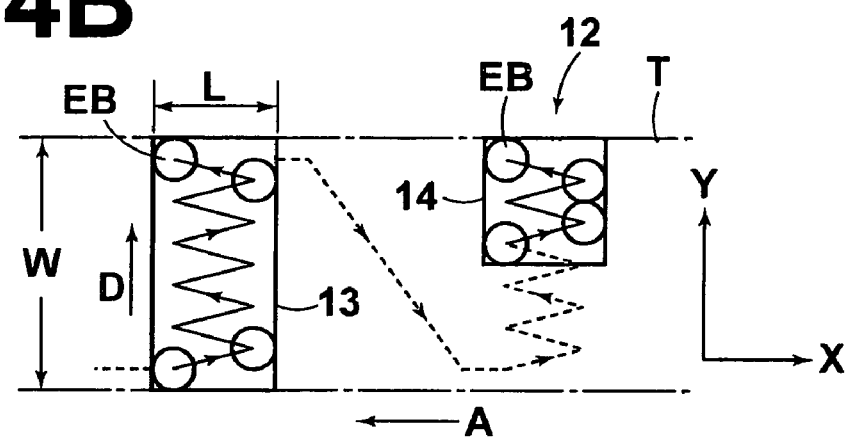
FIG. 4B is an enlarged schematic view that illustrates the manner in which elements that constitute the transfer pattern are drawn by the embodiment of the second electron beam lithography method.
Figure 4C:
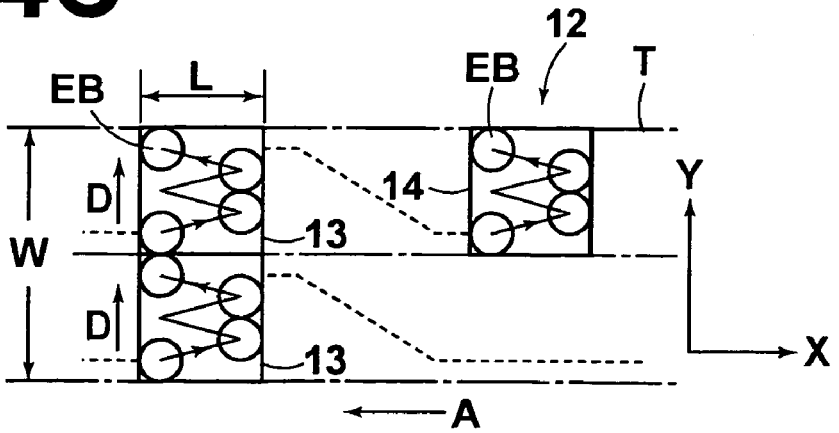
FIG. 4C is an enlarged schematic view that illustrates the manner in which elements that constitute the transfer pattern are drawn by the embodiment of the third electron beam lithography method.
Figure 5:
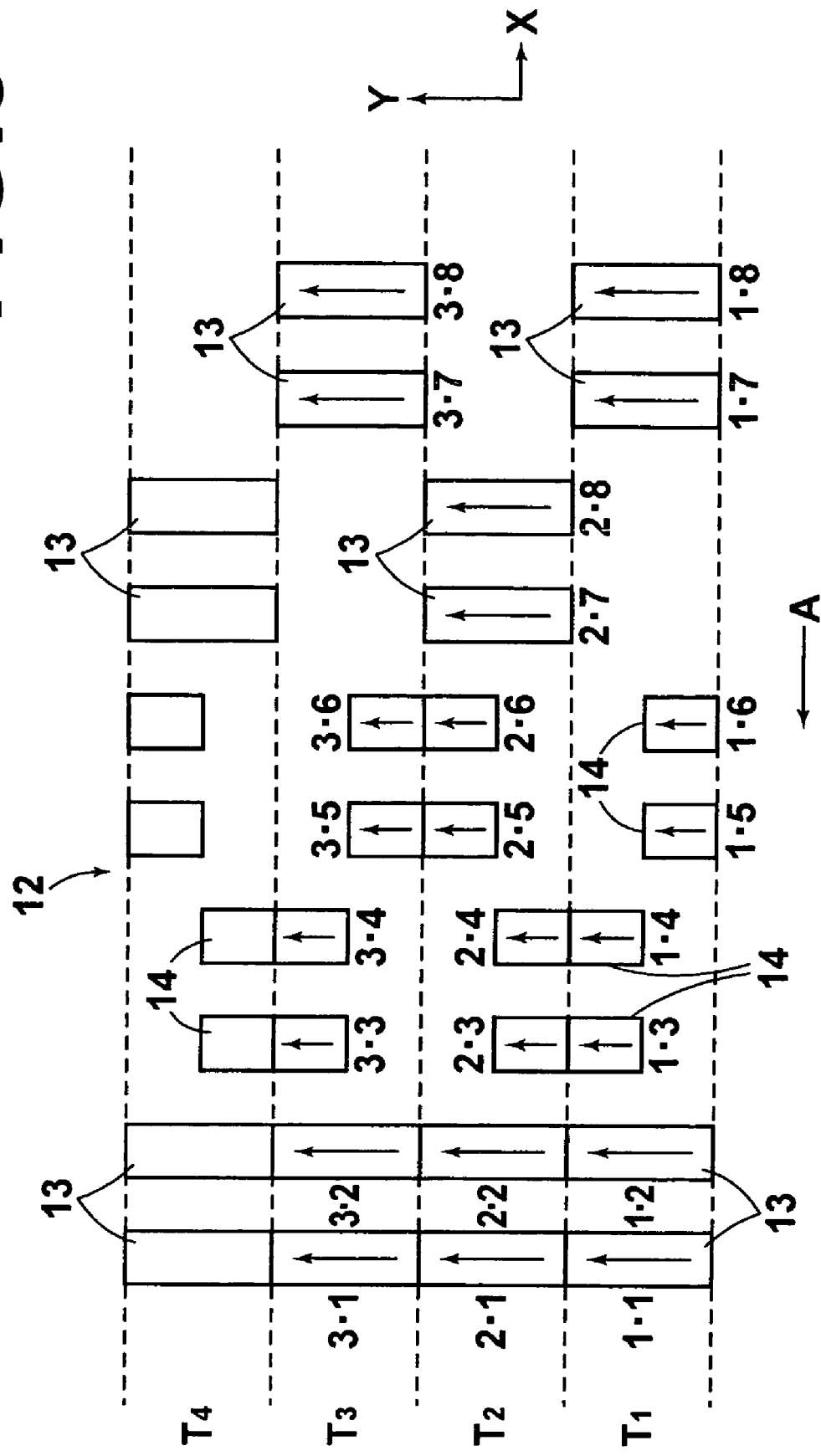
FIG. 5 is an enlarged schematic view that illustrates a drawing order of the servo pattern by the embodiment of the second electron beam lithography method.
Figure 6:
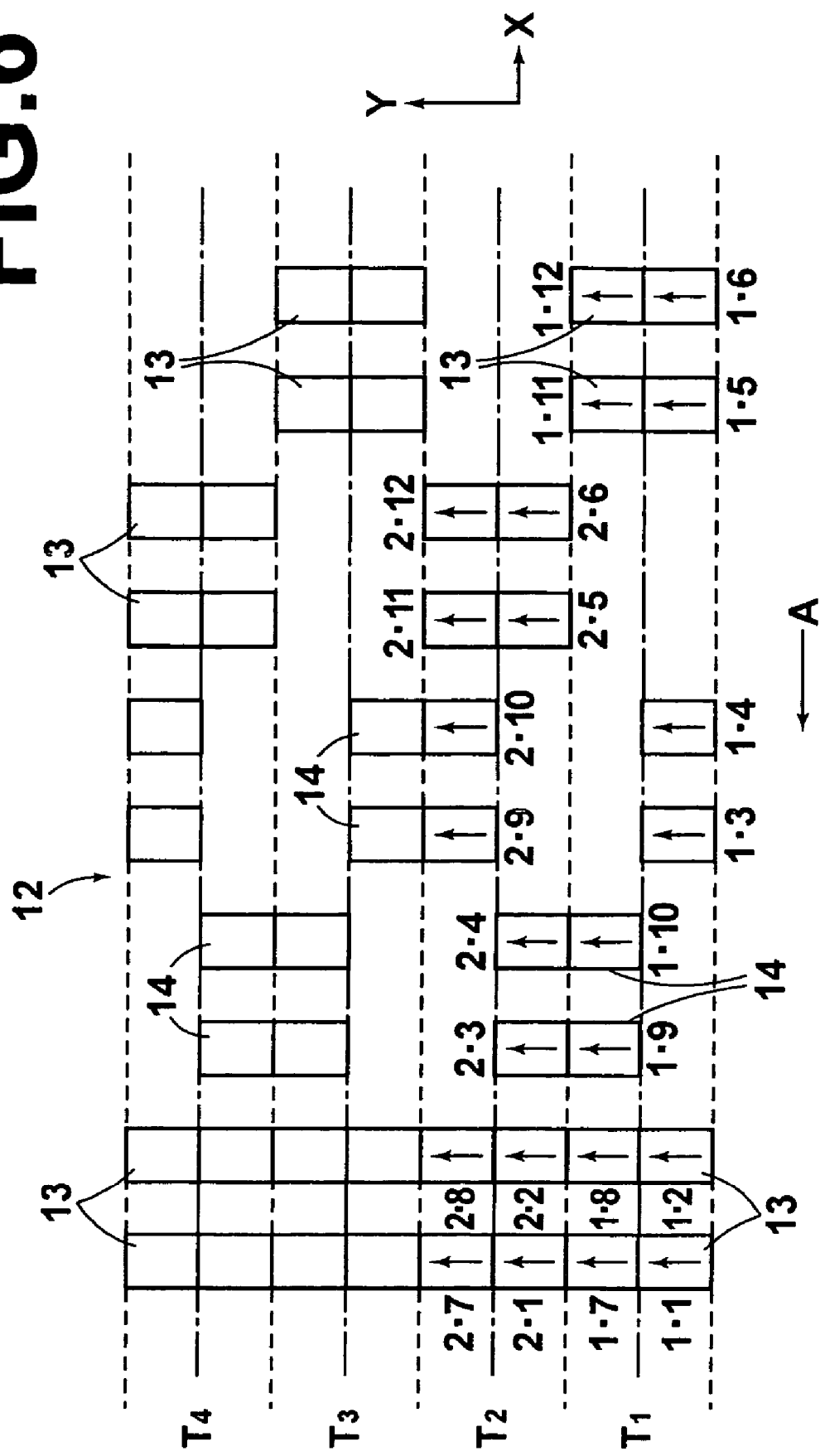
FIG. 6 is an enlarged schematic view that illustrates a drawing order of the servo pattern by the embodiment of the third electron beam lithography method.

Next, embodiments of the second and third electron beam lithography methods of the present invention will be described. FIG. 4A is a plan view that illustrates a transfer pattern of a master carrier for magnetic transfer, which is drawn by the electron beam lithography method of the present invention. FIG. 4B is an enlarged schematic view that illustrates the manner in which elements that constitute the transfer pattern are drawn by the embodiment of the second electron beam lithography method. FIG. 4C is an enlarged schematic view that illustrates the manner in which elements that constitute the transfer pattern are drawn by the embodiment of the third electron beam lithography method. FIG. 5 is an enlarged schematic view that illustrates a drawing order of the servo pattern by the embodiment of the second electron beam lithography method. FIG. 6 is an enlarged schematic view that illustrates a drawing order of the servo pattern by the embodiment of the third electron beam lithography method. Note that the electron beam lithography apparatus illustrated in FIGS. 3A and 3B is utilized to execute the second and third electron beam lithography methods.

As illustrated in FIG. 4A, a transfer pattern 12 (servo pattern) constituted by fine protrusions and recesses, which is formed on a master carrier for magnetic transfer, is formed in an annular region of a disk 11 (discoid substrate) that excludes an outer peripheral portion 11a and an inner peripheral portion 11b. The pattern 12 in FIG. 4A illustrates a case in which transfer data is servo signals. The servo signals are formed in thin regions that extend substantially radially from the central portion of the disk 11, such that they are positioned at equidistant intervals along concentric tracks of the disk 11 and within transfer regions of each sector. Note that in the servo pattern 12 of this example, the servo signals are formed in arcuate radial regions, which are continuous in the radial direction.

FIGS. 4B, 4C, 5, and 6 are enlarged views of a portion of the pattern 12. As illustrated in FIGS. 4B, 4C, 5, and 6, first fine elements 13 and second fine elements 14 (refer to FIG. 2) that correspond to data to be transferred are provided in concentric tracks T. The pattern 12 is constituted by clusters of these elements. The first elements 13 are rectangles having widths W that correspond to the track width, and circumferential lengths (bit length) of L. The second elements 14 are rectangles having widths that correspond to half the track width W, and are formed continuous with another second element 14 of an adjacent track so as to straddle the tracks, shifted a half track from the first elements 13. The elements 13 and 14 will become protrusions (or recesses) in a final master carrier, and other portions will become flat portions.

The servo pattern 12 comprises the first elements 13, which are recorded across the entire track width W. The first elements 13 transfer: preambles (synchronization signals); gray codes (ID signals, such as track numbers); and portions of burst signals, for positioning heads. The second elements 14 transfer portions of burst signals for positioning heads.

Lithography of each of the elements 13 and 14 of the pattern 12 is performed by placing the disk 11, which has resist coated on the surface thereof, on a rotatable stage 41 (refer to FIGS. 3A and 3B) and rotating the stage 41. While the disk 11 is being rotated, an electron beam EB scans the elements 13 and 14 to irradiate and expose the resist one track at a time, from the inner tracks toward the outer tracks, or in the opposite direction.

FIG. 4B and FIG. 5 illustrate the manner in which the embodiment of the second electron beam lithography method of the present invention is executed. In this embodiment, the first and second elements 13 and 14 of a single track are drawn within a single rotation of the disk 11 at once. The fine diameter electron beam EB continuously scans the shapes of the first elements 13 and the second elements 14, which occupy half of a track, so as to fill in the shapes, while the disk 11 is rotated in direction A. Scanning is performed at predetermined phase positions of the concentric tracks T (track width: W), which extend in a circumferential direction X perpendicular to a radial direction Y, when viewed microscopically. Thereby, all of the elements 13 and 14 within a single track are drawn within a single rotation of the disk 11.

The scanning is performed by emitting the electron beam EB, which has a smaller beam diameter than the minimum width of the elements 13 and 14. The electron beam EB is reciprocally oscillated at high speed in the circumferential direction X, which is substantially perpendicular to the radial direction Y, at a uniform oscillation amplitude L. The electron beam EB is also deflected in the radial direction Y, to perform deflection D. Thereby, the electron beam EB scans the shapes of the first elements 13 with a triangular wave trajectory, so as to fill in the shapes. Thereafter, as illustrated by the broken lines in FIG. 4B, only a deflection signal is output, while the electron beam EB is shielded by an OFF operation of the blanking means (aperture member 25, blank 26). Then, irradiation onto half a track is shielded at a predetermined phase position. Next, the blanking means is operated to be ON from the center position of the track to initiate irradiation of the electron beam EB. Then, the electron beam EB scans the shapes of the second elements 14 within half of the track with a triangular wave trajectory, so as to fill in the shapes. In this manner, the elements 13 and 14 are drawn sequentially. After a single track T is drawn in a single rotation, scanning is moved to a next track T, and lithography is performed in a similar manner. Thereby, a desired fine pattern 12 is drawn across the entire region of the disk 11.

FIG. 5 illustrates a drawing order of each element 13 and 14 of a plurality of tracks. First, the first and second elements 13 and 14 of track T1 are drawn in the order of 1-1 to 1-8, by setting the center of deflection in the Y direction to the center of the track T1. That is, the first elements 13 at the beginning of a sector are drawn first, at 1-1 and 1-2. Then, the second elements 14 within the upper half of the track T1 are scanned and drawn by shielding the electron beam EB at the lower half of the track and irradiating only the upper half, at 1-3 and 1-4. Thereafter, the second elements 14 within the lower half of the track T1 are scanned and drawn by shielding the electron beam EB at the upper half of the track, at 1-5 and 1-6. The next two first elements 13 are drawn across the track width W, at 1-7 and 1-8.

In the next rotation, the center of deflection in the Y direction is set to the center of track T2, and the first elements 13 and the second elements 14 are drawn in a similar manner utilizing the blanking means, in the order of 2-1 to 2-8. In the rotation after that, the center of deflection in the Y direction is set to the center of track T3, and the first elements 13 and the second elements 14 are drawn in a similar manner utilizing the blanking means, in the order of 3-1 to 3-8.

FIG. 4C and FIG. 6 illustrate the manner in which the embodiment of the third electron beam lithography method of the present invention is executed. In this embodiment, the first and second elements 13 and 14 of a single track are drawn within two rotations of the disk 11, a half track at a time. The fine diameter electron beam EB continuously scans the shapes of halves of the first elements 13 and the second elements 14, which are positioned in that half of a track, so as to fill in the shapes, while the disk 11 is rotated in direction A. In the next rotation, the remaining halves of the first elements 13, which are positioned at the outer peripheral half of the track, and the second elements 14, which are positioned in that half of the track, are drawn in a similar manner. Thereby, all of the elements 13 and 14 are drawn within two rotations of the disk.

The scanning is performed by emitting the electron beam EB, which has a smaller beam diameter than the minimum width of the elements 13 and 14, in the same manner as described above. The electron beam EB is reciprocally oscillated at high speed in the circumferential direction X, which is substantially perpendicular to the radial direction Y, at a uniform oscillation amplitude L. The electron beam EB is also deflected in the radial direction Y, to perform deflection D for a distance of half a track width (W/2). Thereby, the electron beam EB scans the shapes of the halves of the first elements 13 with a triangular wave trajectory, so as to fill in the shapes. Thereafter, as illustrated by the broken line in FIG. 4C, the apparatus waits for a predetermined drawing phase position, while the electron beam EB is shielded by an OFF operation of the blanking means (aperture member 25, blank 26). Next, the blanking means is operated to be ON to initiate irradiation of the electron beam EB at the predetermined phase position during the next rotation of the disk. Then, the electron beam EB scans the shapes of the remaining halves of the first elements 13 and the second elements 14 within half of the track with a triangular wave trajectory, so as to fill in the shapes. In this manner, the elements 13 and 14 are drawn sequentially. After a single track T is drawn in two rotations, scanning is moved to a next track T, and lithography is performed in a similar manner. Thereby, a desired fine pattern 12 is drawn across the entire region of the disk 11.

FIG. 6 illustrates a drawing order of each element 13 and 14 of a plurality of tracks. First, the deflection width in the Y direction is set to the inner peripheral half width of track T1. The inner peripheral halves of the first elements 13 at the beginning of a sector are drawn first, at 1-1 and 1-2. Then, the blank 26 is employed to wait for the phase position for drawing the second elements 14 of the lower half of the track. When the phase position is reached, the second elements 14 within the lower half of the track T1 are scanned and drawn, at 1-3 and 1-4. Thereafter, the inner peripheral halves of the following two first elements 13 are scanned and drawn, at 1-5 and 1-6. The deflection width in the Y direction is set to the outer peripheral half width of the track T1 in the next rotation. The outer peripheral halves of the two first elements 13 at the beginning of the sector are scanned and drawn, at 1-7 and 1-8. Then, the blank 26 is employed to wait for the phase position for drawing the second elements 14 of the upper half of the track. When the phase position is reached, the second elements 14 within the upper half of the track T1 are scanned and drawn, at 1-9 and 1-10. The outer peripheral halves of the next two first elements 13 are scanned and drawn, at 1-11 and 1-12.

In the next rotation, the deflection width in the Y direction is set to the inner peripheral half of track T2, and the inner peripheral halves of the first elements 13 and the second elements 14 within the lower half of the track T2 are drawn in a similar manner utilizing the blanking means, in the order of 2-1 to 2-6. In the rotation after that, the deflection width in the Y direction is set to the outer peripheral half of track T2, and the outer peripheral halves of the first elements 13 and the second elements 14 within the upper half of the track T2 are drawn in a similar manner utilizing the blanking means, in the order of 2-7 to 2-12.

Movement of the electron beam EB among the tracks is performed by linearly moving the rotatable stage 41 in the radial direction Y. This movement may be performed every time a track is drawn, or every time a plurality of tracks are drawn, depending on a deflectable range of the electron beam EB in the radial direction Y.

In the case that the electron gun that emits the electron beam EB is of the fixed type, as will be described later, rotation of the rotatable stage 41 during lithography of a single rectangular element 13 or 14 will cause shifting in the drawing trajectory. In cases that the influence of this shifting cannot be ignored, it is necessary to perform the deflection D in the radial direction Y while deflecting the center of the reciprocal oscillation (in the X direction) of the electron beam EB in the rotating direction, according to the speed of rotation. On the other hand, there are cases in which the shapes of the elements 13 and 14 of the pattern 12 are not rectangular, but are parallelograms that are inclined with respect to the track direction. In these cases, the deflection D in the radial direction Y is performed while deflecting the center of the reciprocal oscillation of the electron beam EB according to the angle of inclination.

The drawing length L of the elements 13 and 14 in the circumferential direction X, is determined by the oscillation amplitude of the reciprocal oscillation of the electron beam EB in the circumferential direction X. In the case that the lengths L of the elements 13 and 14 in the circumferential direction X exceeds the oscillation amplitude of the electron beam EB, the elements are drawn in a plurality of drawing steps.

The rotating speed of the rotatable stage 41 is adjusted such that rotation is slower when lithography is being performed at the outer peripheral positions of the disk 11, and faster when lithography is being performed at the inner peripheral portions of the disk 11. This is to ensure that the linear speed of the electron beam EB is constant, regardless of the movement in the radial position of drawing portions within the drawing region of the disk 11, that is, movement of the electron beam EB among the tracks. This configuration is preferable, because the constant linear speed of the electron beam EB enables uniform exposure at all drawn portions of the disk, and also because accuracy in the drawing positions can also be improved.

The electron beam EB is scanned as described above, to draw the elements 13 and 14. Lithography data signals, for controlling scanning of the electron beam EB, are transmitted. The transmitted signals control timing and phase, based on reference clock signals, which are generated according to the rotating speed of the rotatable stage 41.

There are cases in which the recording method of the pattern 12 is the CAV (Constant Angluar Velocity) method. In these cases, the lengths of sectors are different between outer tracks and inner tracks. Therefore, the circumferential length L of the elements 13 and 14 are set to be greater at the outer tracks and smaller at the inner tracks. When drawing these elements 13 and 14, the speed of deflection D in the radial direction Y is changed such that it is slower at the outer tracks, and faster at the inner tracks. That is, the deflection speed is varied such that it is caused to be slower the further the drawing portion is from the rotational center of the disk 11. Thereby, the lithography area by the electron beam EB is caused to be uniform per unit time for each of the elements 13 and 14. Accordingly, exposure of the elements 13 and 14 can be performed evenly, under the same conditions. In other words, exposure can be performed under stable conditions, in which the frequency of reciprocal oscillation of the electron beam EB in the circumferential direction X and the electron beam intensity are uniform.

An electron beam lithography apparatus 40, such as that illustrated in FIGS. 3A and 3B, is utilized to perform lithography as described above. The first and second elements 13 and 14 are drawn as described above, by controlling the blanking means, comprising the aperture member 25 and the blank 26, of the lithography apparatus 40.

Figure 7A:
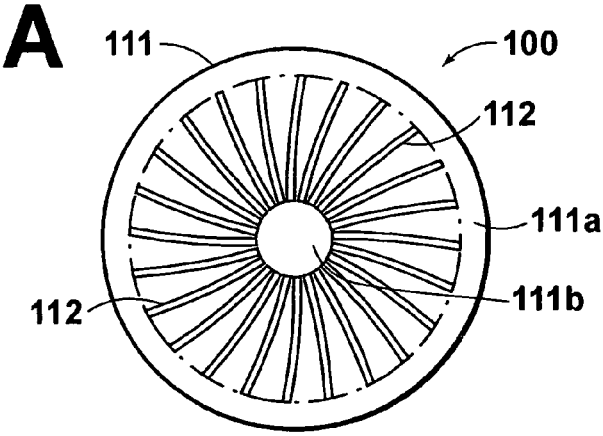
FIG. 7A is a plan view that illustrates a pattern of a patterned master for magnetic transfer of the present invention.
Figure 7B:
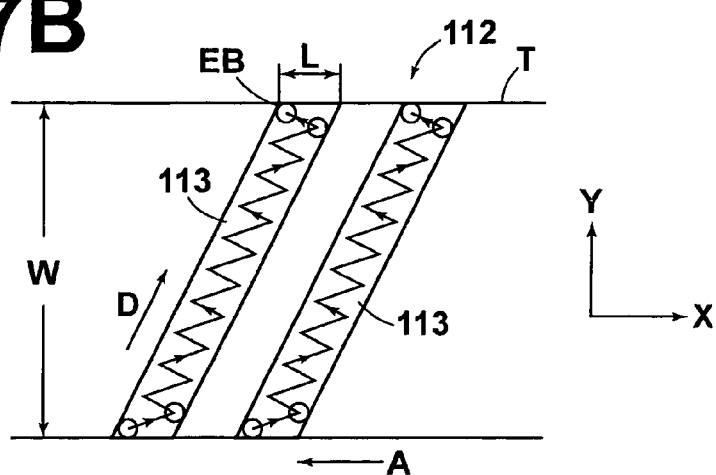
FIG. 7B is an enlarged schematic view that illustrates the basic manner in which elements that constitute the pattern are drawn.
Figure 8:
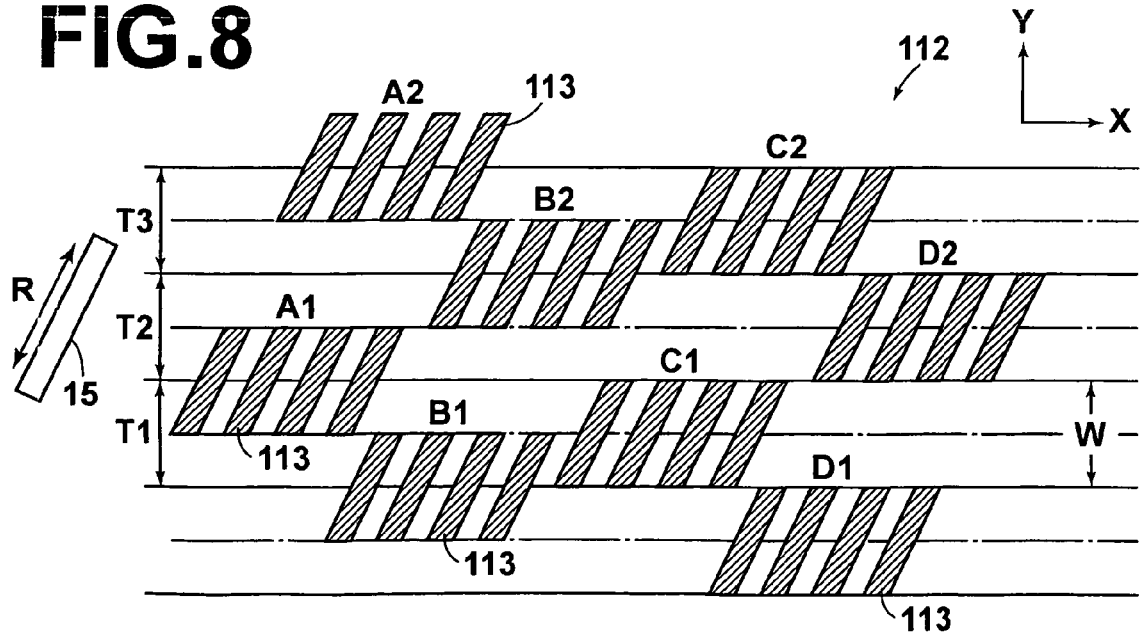
FIG. 8 is an enlarged schematic view that illustrates constituent elements of an amplitude servo pattern.
Figure 9A:
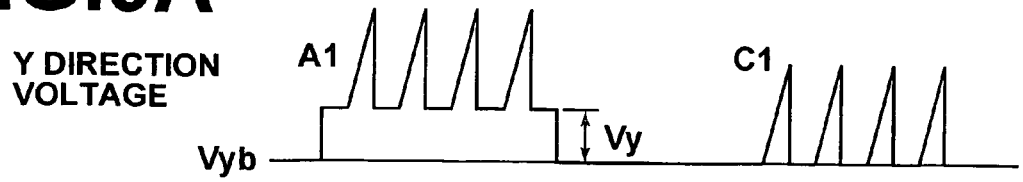
FIGS. 9A, 9B, and 9C are graphs that illustrate Y direction deflection voltages, X direction deflection voltages, and blanking signals that realize beam deflection control to draw the amplitude servo pattern of FIG. 8, respectively.
Figure 9B:
Figure 9C:
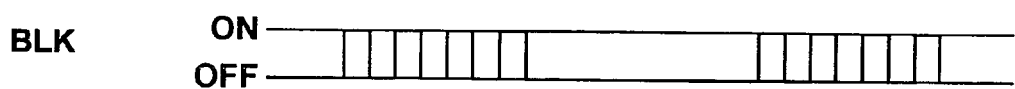
Figure 10:
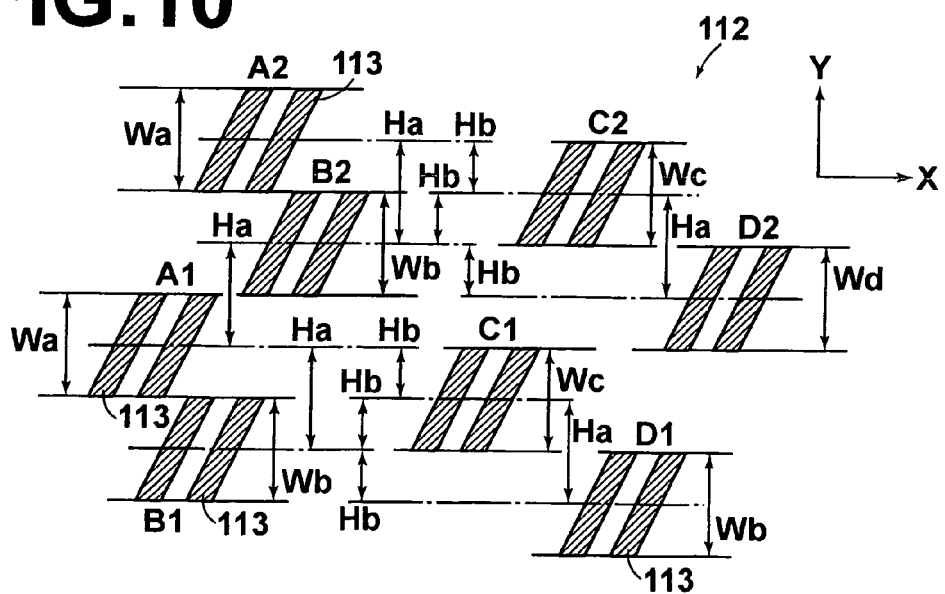
FIG. 10 is a diagram that illustrates dimensional relationships of the elements of the servo pattern, which are considered when defining the accuracy of the elements.
Figure 11A:
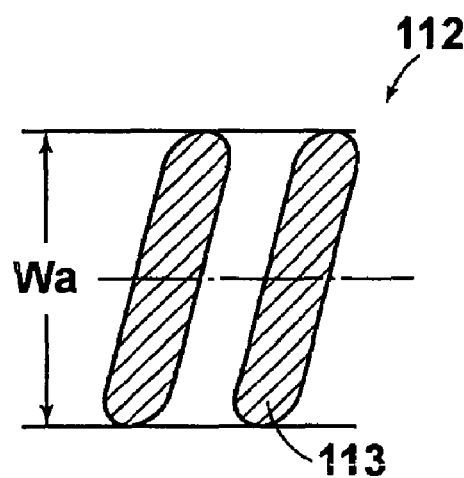
FIGS. 11A and 11B illustrate alternate shapes of bit elements of a servo pattern.
Figure 11B:
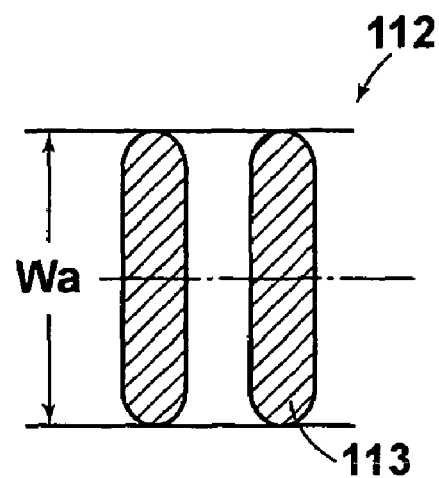

Hereinafter, another embodiment of the present invention will be described in detail, with reference to the attached drawings. FIG. 7A is a plan view that illustrates a pattern of a patterned master for magnetic transfer of the present invention. FIG. 7B is an enlarged schematic view that illustrates the basic manner in which elements that constitute the pattern are drawn. FIG. 8 is an enlarged schematic view that illustrates constituent elements of an amplitude servo pattern. FIGS. 9A, 9B, and 9C are graphs that illustrate Y direction deflection voltages, X direction deflection voltages, and blanking signals that realize beam deflection control to draw the amplitude servo pattern of FIG. 8, respectively. FIG. 10 is a diagram that illustrates dimensional relationships of the elements of the servo pattern, which are considered when defining the accuracy of the elements. FIGS. 11A and 11B illustrate alternate shapes of bit elements of a servo pattern. Note that the electron beam lithography apparatus illustrated in FIGS. 3A and 3B may be employed.

As illustrated in FIG. 7A, a transfer pattern 112 (servo pattern) constituted by fine protrusions and recesses, which is formed on a master carrier for magnetic transfer, is formed in an annular region of a disk 111 (discoid substrate) that excludes an outer peripheral portion 111a and an inner peripheral portion 111b. The pattern 112 in FIG. 7A illustrates a case in which transfer data is servo signals. The servo signals are formed in thin regions that extend substantially radially from the central portion of the disk 111, such that they are positioned at equidistant intervals along concentric tracks of the disk 111 and within transfer regions of each sector. Note that in the servo pattern 112 of this example, the servo signals are formed in arcuate radial regions, which are continuous in the radial direction.

FIG. 7B and FIG. 8 are enlarged views of a portion of the pattern 112. As illustrated in FIG. 7B and FIG. 8, fine elements 113 that correspond to data to be transferred are provided in concentric tracks T. The pattern 112 is constituted by clusters of these elements. The elements 113 are parallelograms having widths W that correspond to the track width, and circumferential lengths (bit lengths) of L. The elements 113 will become protrusions (or recesses) in a final master carrier, and other portions will become flat portions.

Lithography of each element 113 of the pattern 112 is performed by placing the disk 111, which has resist coated on the surface thereof, on a rotatable stage 41 (refer to FIGS. 3A and 3B) and rotating the stage 41. While the disk 11 is being rotated, an electron beam EB scans the elements 13 to irradiate and expose the resist one track at a time, from the inner tracks toward the outer tracks, or in the opposite direction.

The basic manner in which the electron beam lithography method of the present invention is realized will be described. As illustrated in FIG. 7B, the fine diameter electron beam EB continuously scans the shapes of the elements 113 so as to fill in the shapes, while the disk 111 is rotated in direction A. Scanning is performed at predetermined phase positions of the concentric tracks T (track width: W), which extend in a circumferential direction X perpendicular to a radial direction Y, when viewed microscopically.

The scanning is performed by emitting the electron beam EB, which has a smaller beam diameter than the minimum width of the elements 113. The electron beam EB is reciprocally oscillated at high speed in the circumferential direction X. The electron beam EB is also deflected in the radial direction Y, to perform deflection in the direction indicated by arrow D. Thereby, the electron beam EB scans the shapes of the first elements 13 with a triangular wave trajectory, so as to fill in the shapes.

FIG. 8 is an enlarged view that illustrates a portion of an embodiment of an amplitude servo pattern.

A plurality of concentric tracks T are formed at a predetermined track pitch W, and the amplitude servo pattern 112 is recorded on the tracks T. The amplitude servo pattern 112, that is, servo signals, comprise tracking servo signals for positional control of heads. The tracking servo signals are constituted by A, B, C, and D burst portions, which are arranged in the order of A1 through D1 and A2 through D2 in the track direction X. Each of the burst portions A through D (burst bit strings A through D) are constituted by a plurality of the elements 113, which are arranged in a line.

The recording regions of the A burst portions A1, A2 and the B burst portions B1, B2 of the servo pattern 112 are from the approximate center in the width direction of a track T to the approximate center in the width direction of an adjacent track T. That is, the A burst portions A1, A2 and the B burst portions B1, B2 straddle adjacent tracks. For example, each element 113 of the burst portion A1 are provided from the center in the width direction of track T1 to the center in the width direction of track T2. The A burst portions and the B burst portions that straddle two adjacent tracks are alternately provided across a great number of tracks T1, T2, T3 . . . (only three tracks T1 through T3 are illustrated in FIG. 8). The recording regions of C burst portions C1, C2 and D burst portions D1, D2 have their centers in the width direction of tracks, and lengths of approximately one track width W. The C burst portions and the D burst portions are provided on alternate tracks, such that one of the C burst portions and the D burst portions are provided on odd tracks, and the other are provided on even tracks.

A magnetic head 15 is attached to the tip of an arm (not shown), which is movable in the directions indicated by arrow R in FIG. 8. In order to position a readout element (an AMR element, for example) of the head 15 on the track T2, the A1 burst portion and the B2 burst portion are employed. The A1 burst portion straddles the tracks T1 and T2, while the B2 burst portion straddles the tracks T2 and T3. The A1 burst portion is also employed to position the head 15 on the track T1, and the B1 burst portion is also employed to position the head 15 on the track T3.

The head 15 is positioned on the track T2 by positioning servo being applied such that the reproduction amplitude from the A1 burst portion and the B2 burst portion are equal.

In the amplitude servo pattern 112, the A1 burst portion straddles the tracks T1 and T2, while the A2 burst portion straddles the tracks T2 and T3, with an interval of approximately one track pitch W therebetween in the track width direction Y. The A1 and A2 burst portions are provided such that the phases in the track direction X (rotating direction of the magnetic disk) of their elements 113 match, with respect to the direction in which the gaps of the readout and writing elements of the magnetic head 15 extend. In a similar manner, the B through D burst portions are provided such that they have intervals of approximately one track pitch W therebetween, and such that the phases of their elements 113 match, with respect to the direction in which the gaps of the readout and writing elements of the magnetic head 15 extend.

Lithography of the servo pattern 112 is performed such that one of the A burst portions and the B burst portions, which are recorded from the approximate center of the track width W of a track to the approximate center of an adjacent track so as to straddle the tracks, and one of the C burst portions and D burst portions, which are recorded shifted one half of a track from the A and B burst portions, that is, with the centers of track widths as their centers, are drawn within a single rotation of the disk. That is, during lithography of the track T1, the A1 burst portion and the C1 burst portion are drawn continuously. During lithography of the track T2, the B2 burst portion and the D2 burst portion are drawn continuously. During lithography of the track T3, the A2 burst portion and the C2 burst portion are drawn continuously.

The deflection control of the electron beam EB during lithography of the track T1 will be described with reference to FIGS. 9A, 9B, and 9C. FIG. 9A illustrates Y direction deflection voltages, that is, deflection control in the track width direction Y. FIG. 9B illustrates X direction deflection voltages, that is, deflection control in the track direction X. FIG. 9C illustrates ON/OFF signals of a blanking means BLK, to be described later.

First, lithography control for drawing the C1 burst portion, which has the center of the track width W of the track T1 as its center, will be described. A base signal Vyb for deflection control in the track width direction Y is set to a reference position of the track T1. Thereby, the electron beam EB is deflected in the track width direction Y according to triangular waveform signals that correspond to each element 113, as illustrated in FIG. 7B. At this time, a base signal Vxb for deflection control in the track direction X is set to a reference position. Thereby, the electron beam EB is deflected in the track direction X with respect to the rotating direction A of the disk 111, according to triangular waveform signals that correspond to each element 113. Further, by causing the electron beam EB to oscillate reciprocally, the electron beam EB scans the shapes of the elements 113 so as to fill them in. Blanking signals BLK for turning the irradiation of the electron beam EB ON/OFF are output such that beam irradiation is turned ON during scanning exposure of each element 113, and turned OFF by shielding the beam at blank portions other than the elements 113.

When lithography of the track T1 is complete, a shift signal that corresponds to one track pitch is added to the base signal Vyb for deflection in the track width direction Y. Thereby, the electron beam EB is moved to perform lithography of the track T2, and the B2 burst portion and the D2 burst portion are drawn in a manner similar to that described above.

There are two types of control signals for controlling deflection of the electron beam EB in the track width direction Y illustrated in FIG. 9A. The control signals, for deflecting the electron beam in the track width direction one track pitch to change a drawing base position to draw a next track, and the control signals, for deflecting the electron beam in the track width direction for the lengths of each burst portion, are adjusted and controlled independently.

In addition, the control signals, for deflecting the electron beam one track pitch in the track width direction to draw a next track, are adjusted and controlled according to an amount, by which measured values of distances between the centers in a track width direction of burst portions, which are positioned such that they are shifted one track in the track width direction, from among the A, B, C, and D burst portions of the transfer pattern 112, differ from a set value for the track pitch.

Further, from among the control signals in FIG. 9A, for controlling deflection of the electron beam EB in the track width direction Y during a single rotation of the disk 111, control signals, for deflecting the electron beam to change a drawing base position one half of a track pitch from that for drawing the A burst portions or the B burst portions to that for drawing the C burst portions or the D burst portions are controlled and adjusted independently with respect to the control signals, for controlling deflection of the electron beam EB for the lengths of each burst portion in the track width direction Y.

During lithography of the servo pattern 112 illustrated in FIG. 8, dimensional accuracy as illustrated in the positional relationships of FIG. 10 are secured. By securing this level of dimensional accuracy, the accuracy of the elements of the servo pattern 112 are obtained, thereby enabling obtainment of desired servo positioning properties.

First, the accuracy of the transfer pattern 112 is defined such that at least 80% of measured values of distances between the centers in a track width direction Y of burst portions, which are positioned such that they are shifted one track in the track width direction Y, from among the A, B, C, and D burst portions are within a range of ±10% of the set track pitch W.

The A and B burst portions and the C and D burst portions are those that are positioned such that they are shifted one track in the track width direction Y. The accuracy is defined such that at least 80% of the measured values of the distance Ha, between the center positions of lengths Wa of the A burst portions in the track width direction and the center positions of lengths Wb of the B burst portions in the track width direction are within a range of ±10% of the set track pitch W. The accuracy is also defined such that at least 80% of the measured values of the distance Ha, between the center positions of lengths Wc of the C burst portions in the track width direction and the center positions of lengths Wd of the D burst portions in the track width direction are within a range of ±10% of the set track pitch W.

Second, the accuracy of the transfer pattern 112 is defined such that at least 80% of measured values of distances between the centers in a track width direction Y of burst portions, which are positioned such that they are shifted one half of a track in the track width direction, from among the A, B, C, and D burst portions, are within a range of ±10% of one half of the set track pitch W.

The A and C burst portions and the B and D burst portions are those that are positioned such that they are shifted one half of a track in the track width direction Y. The accuracy is defined such that at least 80% of the measured values of the distance Hb, between the center positions of lengths Wa of the A burst portions in the track width direction and the center positions of lengths Wc of the C burst portions in the track width direction are within a range of ±10% of half the set track pitch W. The accuracy is also defined such that at least 80% of the measured values of the distance Hb, between the center positions of lengths Wb of the B burst portions in the track width direction and the center positions of lengths Wd of the D burst portions in the track width direction are within a range of ±10% of half the set track pitch W.

Third, the accuracy of the transfer pattern 112 is defined such that the lengths of the A, B, C, and D burst portions in the track width direction Y are within a range of 90% to 120% of the track pitch. That is, the burst portions A through D are drawn such that the lengths Wa, Wb, Wc, and Wd thereof in the track width direction are within a range of 90% to 120% of the set track pitch.

The relationships among the center positions of the lengths Wa, Wb, Wc, and Wd of the burst portions in the track width direction Y are defined such that similar relationships are established across the great number of tracks.

In addition, the shapes of the elements 113 of the burst portions may be those having arcuate ends, as illustrated in FIG. 11A, or those which are parallel to the track width direction and which have arcuate ends, as illustrated in FIG. 11B. In these cases, measurement of the lengths Wa in the track width direction is performed so as to measure the lengths of the elements 113 in the track direction that include the arcuate ends.

Note that the accuracy may be defined such that triple the value of a standard deviation a of the distances Ha, Hb is 10% of the set track pitch W or 10% of half the set track pitch (W/2). The standard deviation a is determined according to fluctuations in measurement of the lengths Wa, Wb, Wc, and Wd of the elements, which result in fluctuations in the distances Ha, Hb between the center positions of the lengths.

The electron beam lithography apparatus 40 illustrated in FIGS. 3A and 3B may be employed to draw the servo pattern 112 described above.

During lithography by the lithography apparatus 40, the disk 11 is rotated in direction A, and the Y direction and X direction deflecting means 21 and 22 are synchronized and controlled by a frequency function signal, such as triangular waveforms, to cause the electron beam EB to oscillate cyclically in a predetermined direction with a constant amplitude. As a result, the electron beam EB is scanned a plurality of times in the circumferential direction X of the elements 113 to draw their shapes. The pattern 112 is drawn by repeating the above. During lithography of the elements 113 of the A and B burst portions, the base voltage of the drive voltage of the Y direction deflecting means 21 is shifted and applied, to shift the center of movement for the width W a half track toward the outer periphery. Thereby, the elements 113 are drawn continuously within a single rotation of the disk 11. Further, independent control of the control signals as described above is executed, based on measurements corresponding to the defined accuracies of the drawing positions of each element 113.

Note that it is desirable for the output and beam diameter of the electron beam EB to be adjusted, taking into consideration the shapes of the elements 113 and the sensitivity of the electron beam lithography resist.

A patterned master carrier 100 for magnetic transfer is produced as described above. A preformatted magnetic recording medium can be produced, by placing the uneven transfer pattern 112 of the patterned master carrier 100 into close contact with a magnetic recording layer of a magnetic recording medium (not shown), and applying a transfer magnetic field thereto. Thereby, magnetism of the magnetic recording layer is reversed according to the transfer pattern 12, and the amplitude servo pattern is transferred and recorded on the magnetic recording medium.

What is claimed is:

1. An electron beam lithography method, for drawing elements that constitute a transfer pattern of a magnetic transfer master carrier, by scanning an electron beam on a disk having resist coated thereon, placed on a rotatable stage which is also movable in the radial direction, while rotating the rotatable stage; the transfer pattern comprising: first elements, which are arranged within track widths of circumferential tracks within transfer regions at each sector thereof; and second elements, which are arranged shifted a half track width from the tracks, to straddle two adjacent tracks; the electron beam lithography method comprising the steps of: unidirectionally rotating the disk; deflecting the electron beam in the radial direction within a single track of the disk; and scanning the electron beam so as to fill in the shapes of the first elements of the track to draw the first elements, simultaneously deflecting the electron beam a half track width with respect to the drawing position of the first elements and scanning the electron beam so as to fill in the shapes of the second elements, which straddle adjacent tracks, to draw the second elements.

2. An electron beam lithography method as defined in claim 1, wherein: drawing lengths of the elements in the circumferential direction are defined by the amplitude of high speed reciprocal oscillation of the electron beam in the circumferential direction, which is substantially perpendicular to the radial direction of the disk.

3. An electron beam lithography method as defined in claim 1, wherein: the transfer pattern is drawn across the entire surface of the disk, by shifting the relative position of the electron beam with respect to the disk in the radial direction thereof following completion of lithography of the elements of a single track or of a plurality of tracks.

4. An electron beam lithography method as defined in claim 1, wherein: the transfer pattern is a servo pattern that includes burst portions.

5. An electron beam lithography method, for drawing elements that constitute a transfer pattern of a magnetic transfer master carrier, by scanning an electron beam emitted by an electron beam lithography apparatus on a disk having resist coated thereon, placed on a rotatable stage which is also movable in the radial direction, while rotating the rotatable stage; the transfer pattern comprising: first elements, which are arranged within track widths of circumferential tracks within transfer regions at each sector thereof; and second elements, which are provided within half track widths of the tracks; the electron beam lithography apparatus comprising: deflecting means, for deflecting the emitted electron beam in the radial direction of the disk; and blanking means, for shielding irradiation of the electron beam onto portions other than drawing portions; the electron beam lithography method comprising the steps of: unidirectionally rotating the disk; deflecting the electron beam in the radial direction one track width at a time with the deflecting means, to draw the first and second elements of each track within a single rotation of the disk; the first elements being drawn by irradiating the electron beam of a deflection amount that corresponds to the track width; and the second elements being drawn by shielding irradiation of the electron beam of a deflection amount that corresponds to half the track width, while irradiating the electron beam of a deflection amount that corresponds to the other half of the track width.

6. An electron beam lithography method as defined in claim 5, wherein: drawing lengths of the elements in the circumferential direction are defined by the amplitude of high speed reciprocal oscillation of the electron beam in the circumferential direction, which is substantially perpendicular to the radial direction of the disk.

7. An electron beam lithography method as defined in claim 5, wherein: the transfer pattern is a servo pattern that includes burst portions.

8. An electron beam lithography method, for drawing elements that constitute a transfer pattern of a magnetic transfer master carrier, by scanning an electron beam emitted by an electron beam lithography apparatus on a disk having resist coated thereon, placed on a rotatable stage which is also movable in the radial direction, while rotating the rotatable stage; the transfer pattern comprising: first elements, which are arranged within track widths of circumferential tracks within transfer regions at each sector thereof; and second elements, which are provided within half track widths of the tracks; the electron beam lithography apparatus comprising: deflecting means, for deflecting the emitted electron beam in the radial direction of the disk; and blanking means, for shielding irradiation of the electron beam onto portions other than drawing portions; the electron beam lithography method comprising the steps of: unidirectionally rotating the disk; deflecting the electron beam in the radial direction one half track width at a time with the deflecting means, to draw the first and second elements of each track in one half of the tracks at a time; half of the first elements and the second elements positioned in the half of the track being drawn during a first rotation to scan a single track; and the remaining half of the first elements and the second elements positioned in the other half of the track being drawn during a second rotation to scan the single track.

9. An electron beam lithography method as defined in claim 8, wherein: drawing lengths of the elements in the circumferential direction are defined by the amplitude of high speed reciprocal oscillation of the electron beam in the circumferential direction, which is substantially perpendicular to the radial direction of the disk.

10. An electron beam lithography method as defined in claim 8, wherein: the transfer pattern is a servo pattern that includes burst portions.

11. A patterned master carrier for magnetic transfer, having a transfer pattern of protrusions and recesses, the transfer pattern comprising: a plurality of tracks, which are formed at equidistant track pitches; and an amplitude servo pattern constituted by A burst portions and B burst portions, which are recorded on alternate tracks from the central portion of a track to the central portion of an adjacent track so as to straddle the tracks; and C burst portions and D burst portions, which are recorded on alternate tracks with the centers of track widths as their centers so as to be recorded across the track widths; the A, B, C, and D burst portions being arranged in the track direction; the accuracy of the amplitude servo pattern being defined such that at least 80% of measured values of distances between the centers in a track width direction of burst portions, which are positioned such that they are shifted one track in the track width direction, from among the A, B, C, and D burst portions are within a range of ±10% of the track pitch.

12. A patterned master carrier for magnetic transfer as defined in claim 11, wherein: the accuracy of the amplitude servo pattern is defined such that the lengths of the A, B, C, and D burst portions in the track width direction are within a range of 90% to 120% of the track pitch.

13. A patterned master carrier for magnetic transfer, having a transfer pattern of protrusions and recesses, the transfer pattern comprising: a plurality of tracks, which are formed at equidistant track pitches; and an amplitude servo pattern constituted by A burst portions and B burst portions, which are recorded on alternate tracks from the central portion of a track to the central portion of an adjacent track so as to straddle the tracks; and C burst portions and D burst portions, which are recorded on alternate tracks with the centers of track widths as their centers so as to be recorded across the track widths; the A, B, C, and D burst portions being arranged in the track direction; the accuracy of the amplitude servo pattern being defined such that at least 80% of measured values of distances between the centers in a track width direction of burst portions, which are positioned such that they are shifted one half of a track in the track width direction, from among the A, B, C, and D burst portions are within a range of ±10% of one half of the track pitch.

14. A patterned master carrier for magnetic transfer as defined in claim 13, wherein: the accuracy of the amplitude servo pattern is defined such that the lengths of the A, B, C, and D burst portions in the track width direction are within a range of 90% to 120% of the track pitch.

15. A lithography method, for drawing a transfer pattern bearing an amplitude servo pattern that has servo burst signals constituted by A, B, C, and D burst portions on a patterned master carrier for magnetic transfer, by scanning an electron beam on a disk having resist coated thereon, placed on a rotatable stage, while rotating the rotatable stage; one of the A burst portions and the B burst portions, which are recorded on alternate tracks from the central portion of a track to the central portion of an adjacent track so as to straddle the tracks, and one of the C burst portions and D burst portions, which are recorded on alternate tracks with the centers of track widths as their centers so as to be recorded across the track widths, being drawn within a single rotation of the disk; the method comprising:
adjusting and controlling independently control signals, for deflecting the electron beam in the track width direction one track pitch to change a drawing base position to draw a next track, and control signals, for deflecting the electron beam in the track width direction for the lengths of the burst portions in the track width direction.

16. A lithography method as defined in claim 15, wherein the: control signals, for deflecting the electron beam one track pitch in the track width direction to draw a next track, are adjusted and controlled according to an amount, by which measured values of distances between the centers in a track width direction of burst portions, which are positioned such that they are shifted one track in the track width direction, from among the A, B, C, and D burst portions, differ from a set value for the track pitch.

17. A lithography method, for drawing a transfer pattern bearing an amplitude servo pattern that has servo burst signals constituted by A, B, C, and D burst portions on a patterned master carrier for magnetic transfer, by scanning an electron beam on a disk having resist coated thereon, placed on a rotatable stage, while rotating the rotatable stage; one of the A burst portions and the B burst portions, which are recorded on alternate tracks from the central portion of a track to the central portion of an adjacent track so as to straddle the tracks, and one of the C burst portions and D burst portions, which are recorded on alternate tracks with the centers of track widths as their centers so as to be recorded across the track widths, being drawn within a single rotation of the disk; and control signals, for deflecting the electron beam in the track width direction one half of a track pitch to change a drawing base position from that for drawing the A burst portions or the B burst portions to that for drawing the C burst portions or the D burst portions within a single rotation of the disk, the method comprising:
adjusting and controlling independently control signals, for deflecting the electron beam in the track width direction for the lengths of the burst portions in the track width direction within a single rotation of the disk.

18. A lithography method as defined in claim 17, wherein the
control signals, for deflecting the electron beam to change a drawing base position one half of a track pitch from that for drawing the A burst portions or the B burst portions to that for drawing the C burst portions or the D burst portions within a single rotation of the disk, are adjusted and controlled according to an amount, by which measured values of distances between the centers in a track width direction of burst portions, which are positioned such that they are shifted one half of a track in the track width direction, from among the A, B, C, and D burst portions, differ from one half of a set value for the track pitch.

19. A lithography method as defined in claim 17, further comprising:
controlling drawing phase shift control signals, for deflecting the electron beam in the track direction, simultaneously and separately from the control signals, for deflecting the electron beam to change a drawing base position one half of a track pitch from that for drawing the A burst portions or the B burst portions to that for drawing the C burst portions or the D burst portions within a single rotation of the disk.

20. A method for producing a preformatted magnetic recording medium, comprising the steps of: placing a patterned master carrier for magnetic transfer in close contact with a magnetic recording medium; and applying a transfer magnetic field to the master carrier and the magnetic recording medium in their close contact state, thereby transferring an amplitude servo pattern borne by the master carrier onto the magnetic recording medium; the master carrier having: a plurality of tracks, which are formed at equidistant track pitches; and an amplitude servo pattern having servo burst signals constituted by A burst portions and B burst portions, which are recorded on alternate tracks from the central portion of a track to the central portion of an adjacent track so as to straddle the tracks, and C burst portions and D burst portions, which are recorded on alternate tracks with the centers of track widths as their centers so as to be recorded across the track widths; the A, B, C, and D burst portions being arranged in the track direction; the amplitude servo pattern being recorded as an uneven transfer pattern on the master carrier; and the accuracy of the amplitude servo pattern being defined such that at least 80% of measured values of distances between the centers in a track width direction of burst portions, which are positioned such that they are shifted one track in the track width direction, from among the A, B, C, and D burst portions are within a range of ±10% of the track pitch.

* * * * *